US012706140B2

(12) United States Patent
Chen et al.

(10) Patent No.: US 12,706,140 B2
(45) Date of Patent: Aug. 11, 2026

(54) BURIED METAL TECHNIQUES FOR MEMORY APPLICATIONS

(71) Applicant: Arm Limited, Cambridge (GB)

(72) Inventors: Andy Wangkun Chen, Austin, TX (US); Vivek Asthana, Noida (IN); Sony, Noida (IN); Ettore Amirante, Nice (FR); Yew Keong Chong, Austin, TX (US)

(73) Assignee: Arm Limited, Cambridge (GB)

( * ) Notice: Subject to any disclaimer, the term of this patent is extended or adjusted under 35 U.S.C. 154(b) by 103 days.

(21) Appl. No.: 17/980,335

(22) Filed: Nov. 3, 2022

(65) Prior Publication Data

US 2024/0153551 A1 May 9, 2024

(51) Int. Cl.
*G11C 11/41* (2006.01)
*G11C 5/02* (2006.01)
*G11C 5/06* (2006.01)
*G11C 11/418* (2006.01)

(52) U.S. Cl.
CPC ............ *G11C 11/418* (2013.01); *G11C 5/025* (2013.01); *G11C 5/063* (2013.01)

(58) Field of Classification Search
CPC ..... G11C 11/418; G11C 11/419; G11C 5/025; G11C 5/063
See application file for complete search history.

(56) References Cited

U.S. PATENT DOCUMENTS 7,420,832 B1 * 9/2008 Lukes ...................... G11C 8/14 365/72
8,937,368 B2 1/2015 Harada et al.
9,559,040 B2 * 1/2017 Batra ...................... H01L 25/50
9,780,210 B1 10/2017 Goktepeli et al.
9,870,979 B2 * 1/2018 Batra ...................... H01L 25/50
10,950,546 B1 3/2021 Doornbos
11,200,961 B1 12/2021 Uribe
11,443,777 B2 9/2022 Chen et al.
2011/0095367 A1 4/2011 Su et al.
2014/0342529 A1 11/2014 Goktepeli et al.
2015/0121052 A1 4/2015 Emma et al.
(Continued)

FOREIGN PATENT DOCUMENTS

EP 2988305 A1 2/2016
KR 20180091687 A 8/2018
(Continued)

OTHER PUBLICATIONS

TIPO Office Action; TW 110133921; Jan. 14, 2025.
(Continued)

*Primary Examiner* — Vanthu T Nguyen
(74) *Attorney, Agent, or Firm* — Pramudji Law Group PLLC; Ari Pramudji

(57) ABSTRACT

Various implementations described herein are related to a device having multi-page memory with a first core array and bitcells accessible via first wordlines and a second core array with bitcells accessible via second wordlines. The device may have wordline drivers coupled to the bitcells in the first core array via the first wordlines and to the bitcells in the second core array via the second wordlines. The device may have buried metal lines formed within a substrate, and the buried metal lines may be used to couple the wordline drivers to the first wordlines.

18 Claims, 16 Drawing Sheets

(56) References Cited

U.S. PATENT DOCUMENTS

| | | | |
|---|---|---|---|
| 2016/0140276 | A1 | 5/2016 | Sarhan et al. |
| 2016/0306412 | A1 | 10/2016 | Kolla |
| 2016/0320821 | A1 | 11/2016 | Mair et al. |
| 2017/0336845 | A1 | 11/2017 | Raj et al. |
| 2017/0373026 | A1 | 12/2017 | Goktepeli |
| 2019/0097592 | A1 | 3/2019 | Goktepeli |
| 2019/0296704 | A1 | 9/2019 | Iwamoto |
| 2020/0203276 | A1 | 6/2020 | Hiblot et al. |
| 2020/0234737 | A1 | 7/2020 | Jayapal et al. |
| 2021/0111105 | A1 | 4/2021 | Kim et al. |
| 2021/0225830 | A1 | 7/2021 | Liu |
| 2022/0084561 | A1 | 3/2022 | Chen et al. |
| 2022/0123751 | A1 | 4/2022 | Thyagarajan et al. |
| 2022/0262791 | A1 | 8/2022 | Shi et al. |
| 2022/0328399 | A1 | 10/2022 | Preston et al. |

FOREIGN PATENT DOCUMENTS

| | | | |
|---|---|---|---|
| TW | 201802711 | A | 1/2018 |
| TW | 202029434 | A | 8/2020 |

OTHER PUBLICATIONS

KIPO Office Action; KR 10-2021-0120975; Aug. 1, 2025.
TIPO Allowance; TW 110133921; Apr. 15, 2025.
KIPO Allowance; KR 10-2021-0120975; May 21, 2026.

* cited by examiner

100

Buried Metal Line (BML) Architecture 104

Frontside Metal Routing (FSMR) 108

Frontside Signal Lines
Frontside Core Array Circuitry (Array of Bitcells)
Frontside Metal Layers (FM0, FM1, FM2, … , FMN)
Frontside Inter-Layer Vias (FSV)

Frontside-to-Backside Transition 114

Semiconductor (Silicon) Substrate
Buried Transition Vias (BTV)
Through-Silicon Vias (TSV)

Backside Metal Routing (BSMR) 118

Buried Backside Signal Lines
Backside Metal Layers (BM0, BM1, BM2, … , BMN)
Backside Inter-Layer Vias (BSV)
Backside Power Connection Bumps (BSB)

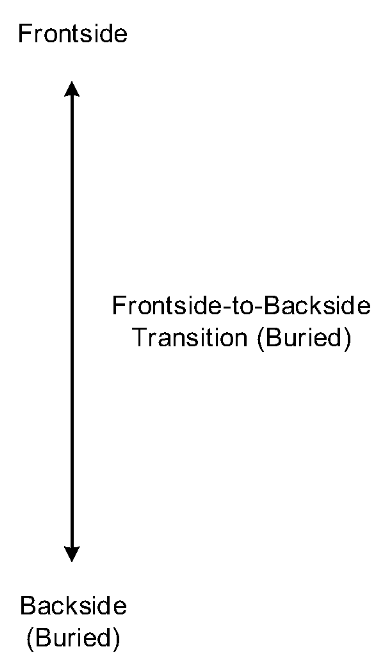

FIG. 1

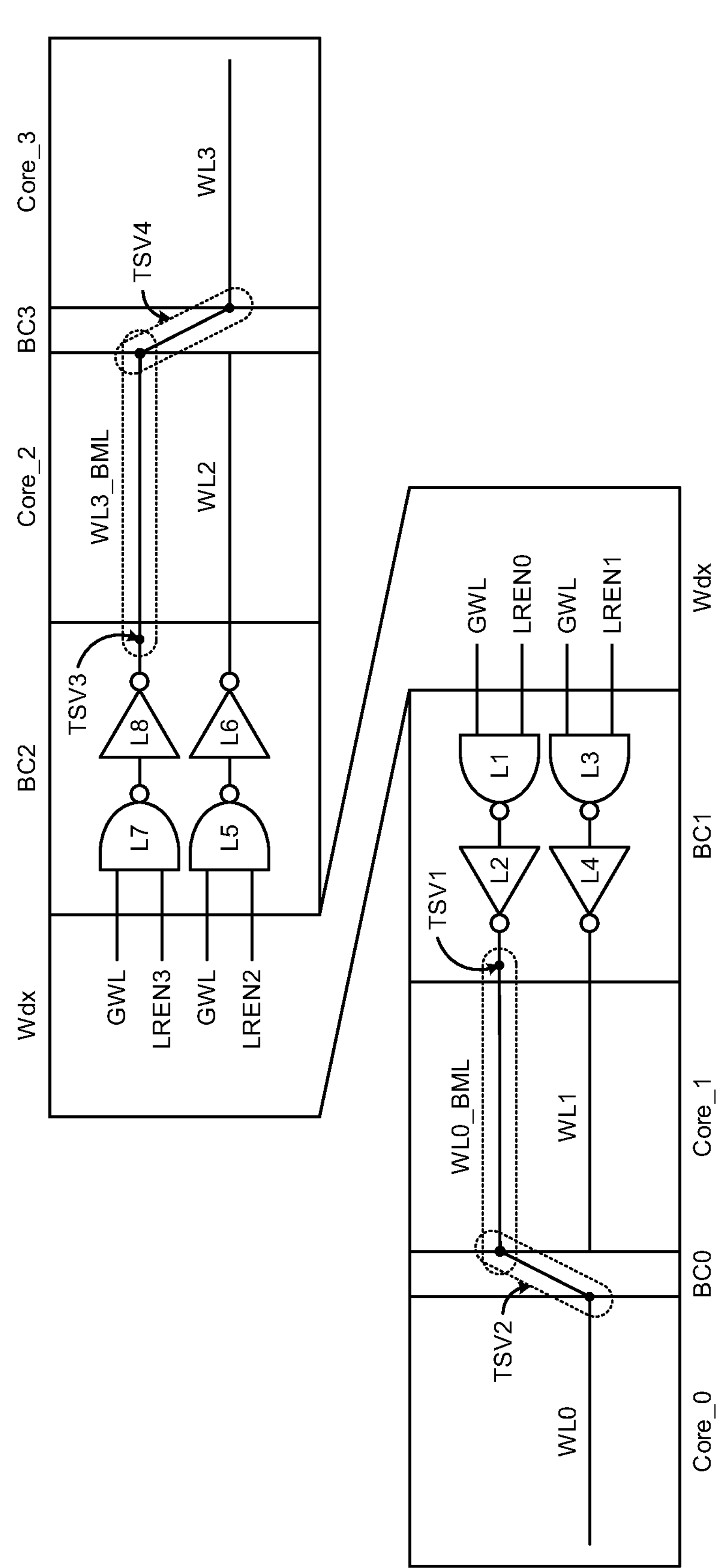
FIG. 3B1

300B2
Buried Metal Line (BML) Architecture 304,304B2
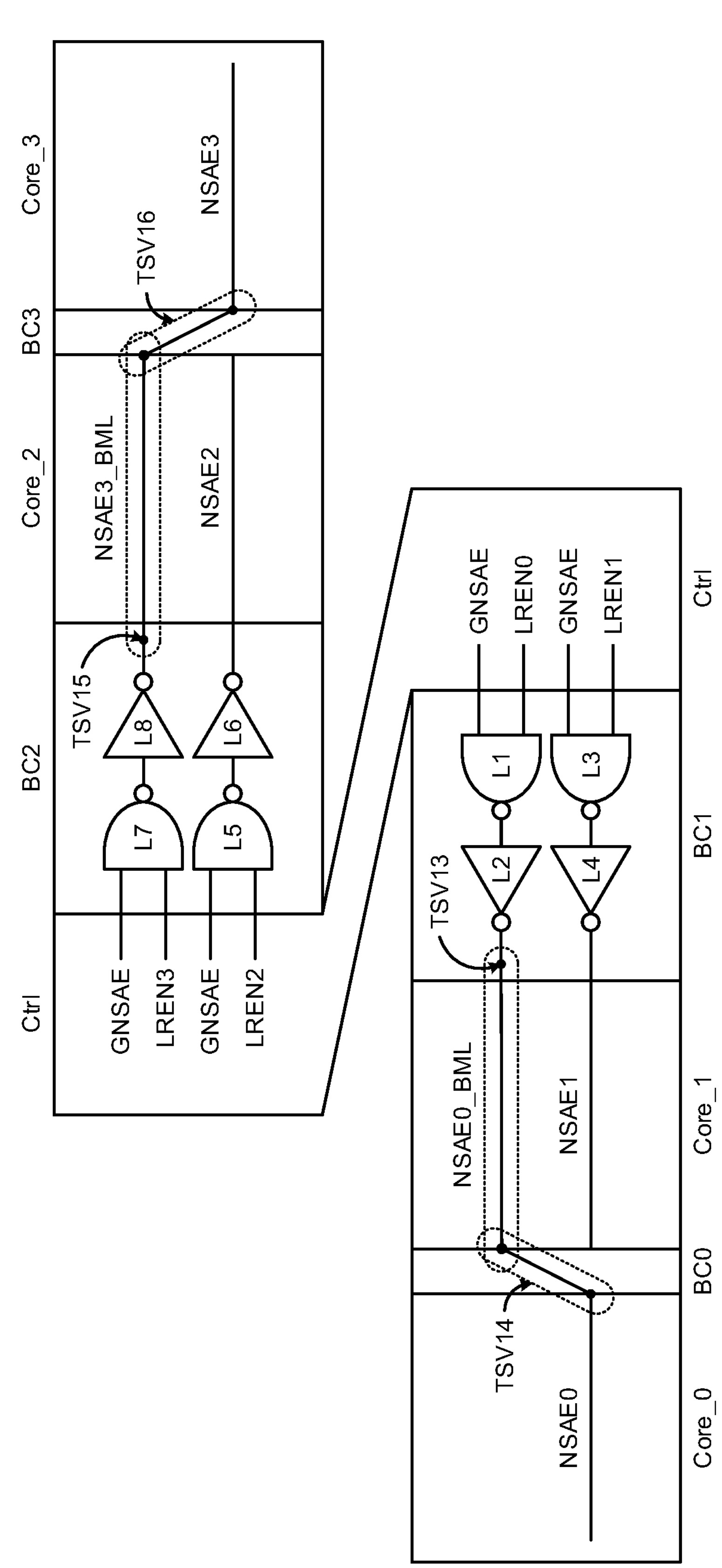
FIG. 3B2

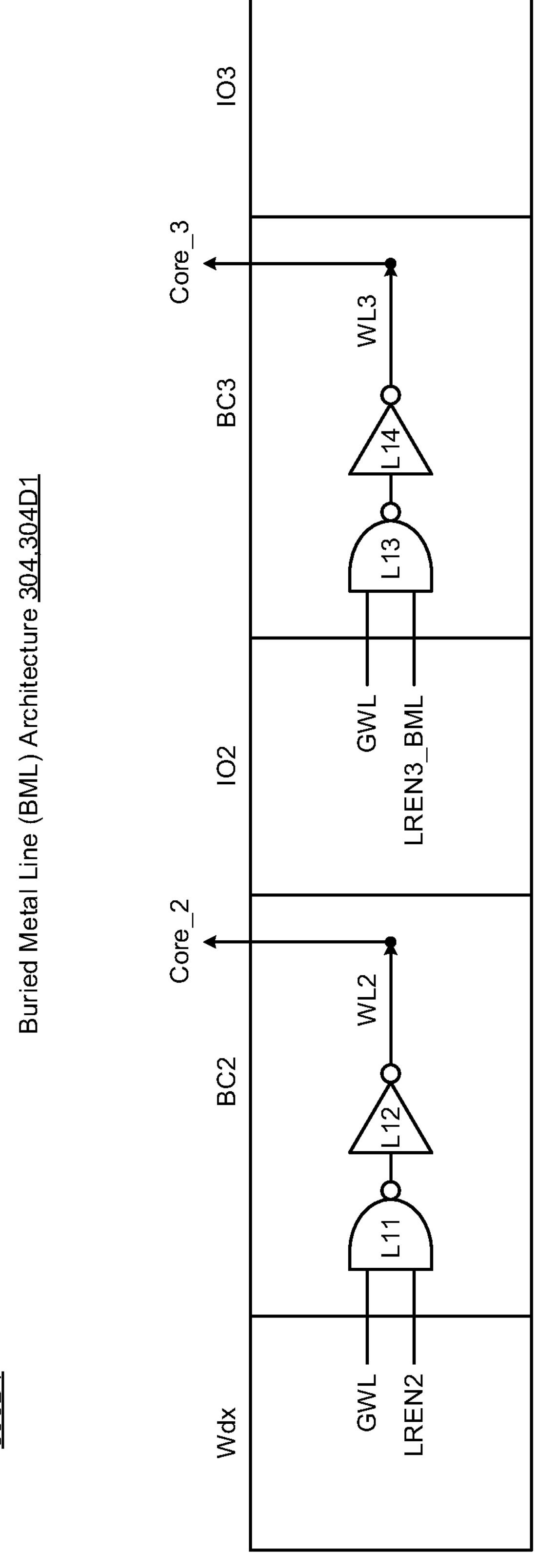
FIG. 3D1

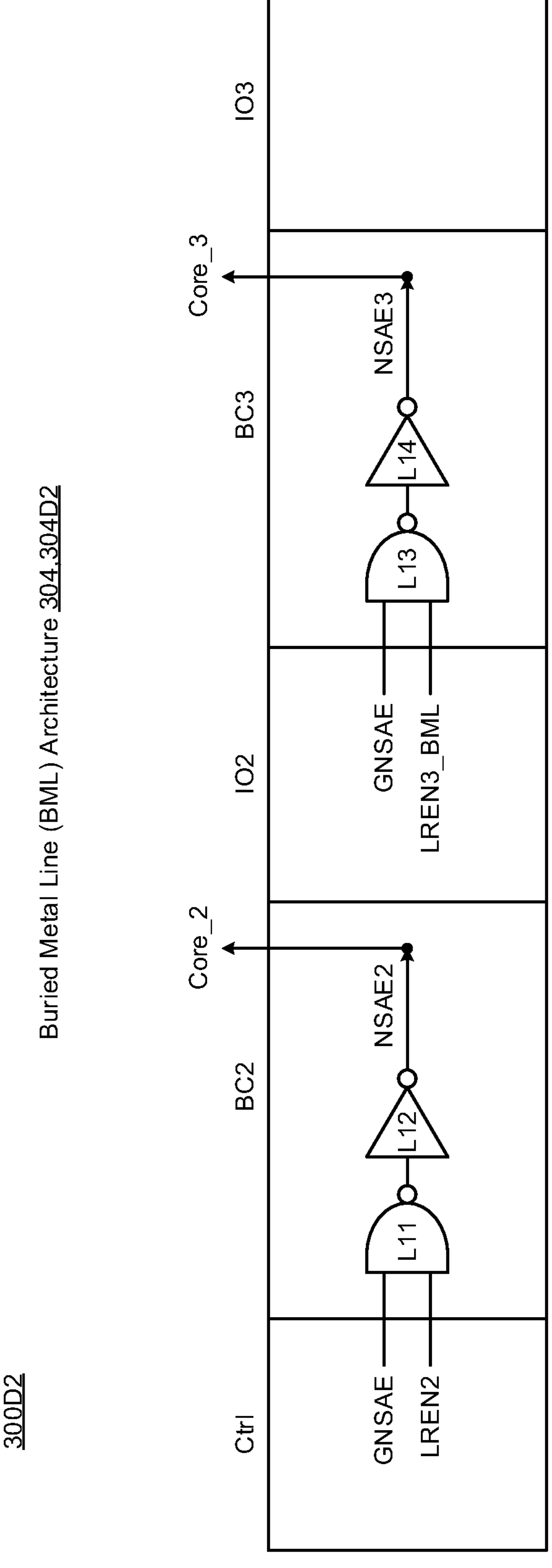
FIG. 3D2

300F1
Buried Metal Line (BML) Architecture 304,304F1
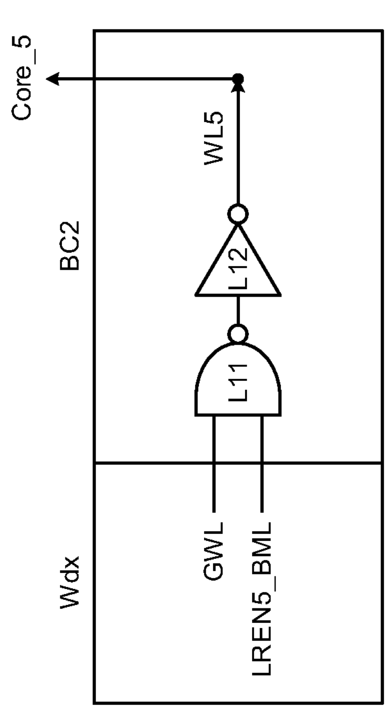
FIG. 3F1

300F2
Buried Metal Line (BML) Architecture 304,304F2
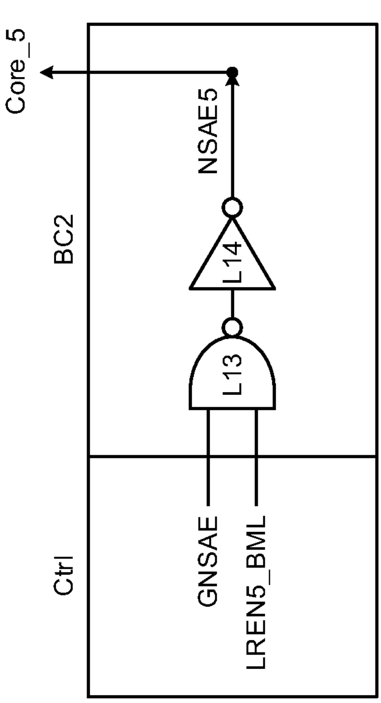
FIG. 3F2

Figure 4B:
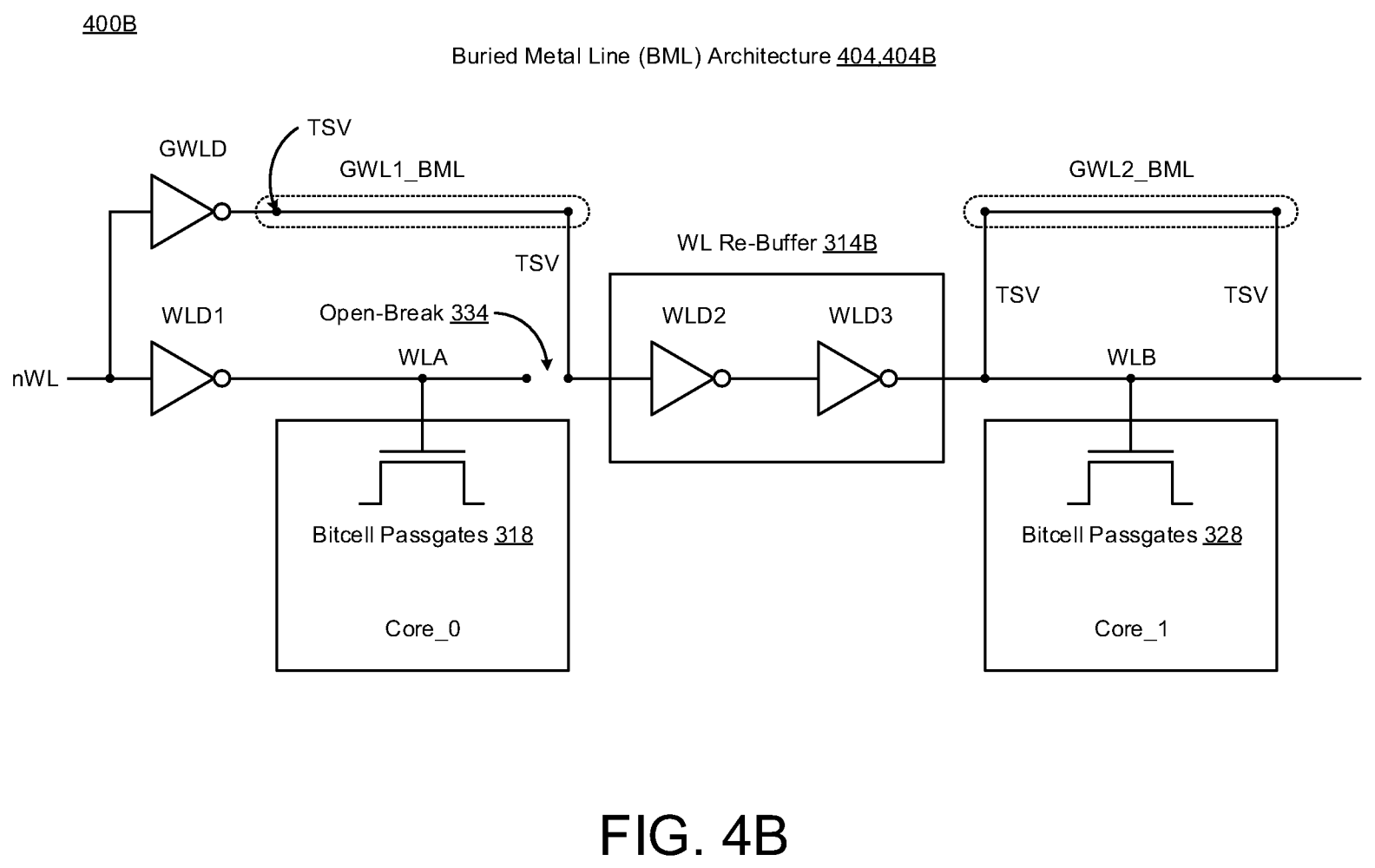

400B

Buried Metal Line (BML) Architecture 404,404B nWL

GWLD

WLD1

TSV

GWL1_BML

Open-Break 334

WLA

TSV

Bitcell Passgates 318

Core_0

WL Re-Buffer 314B

WLD2

WLD3

GWL2_BML

TSV

WLB

TSV

Bitcell Passgates 328

Core_1

Buried Metal Line (BML) Architecture 504,504A

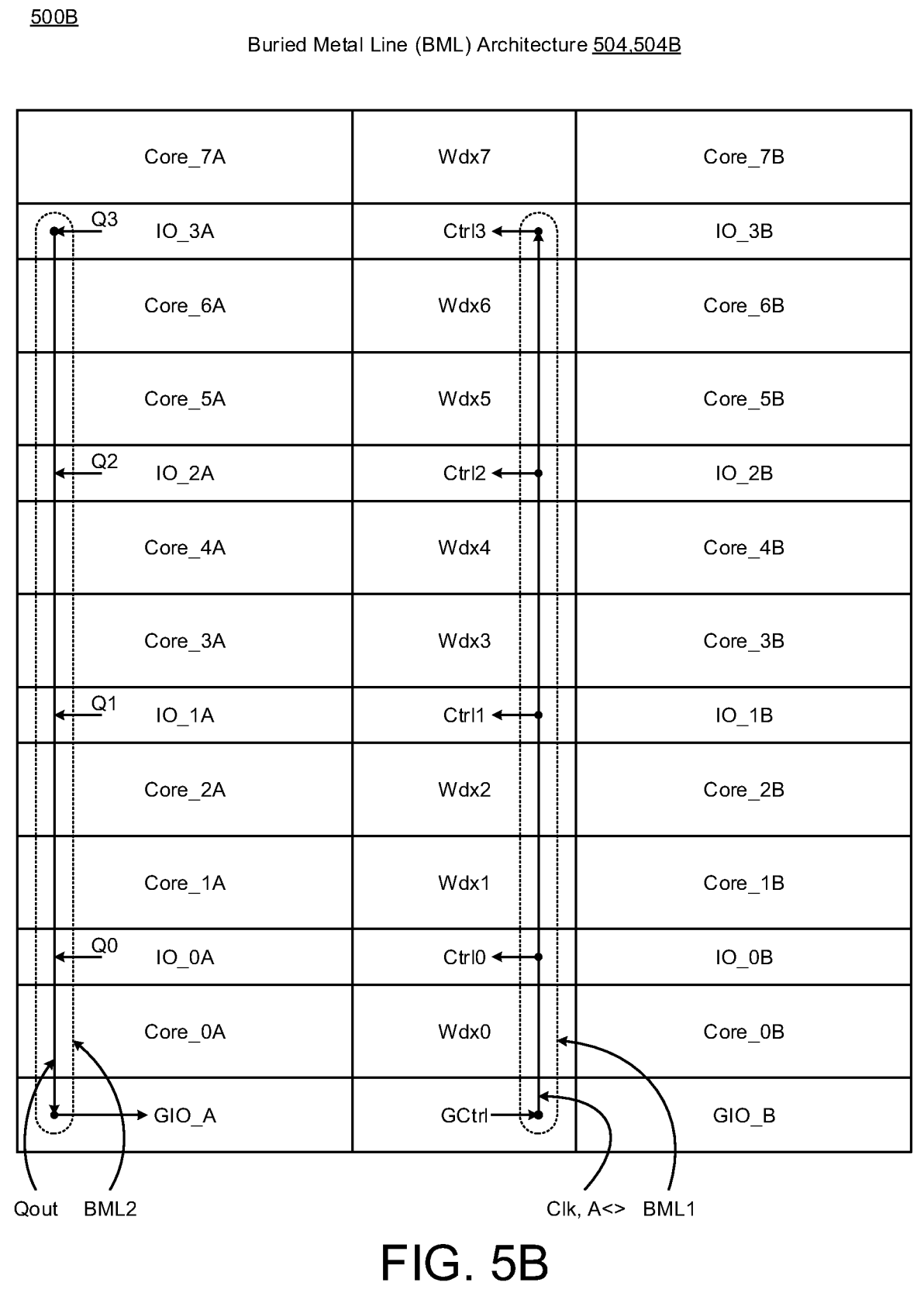

500B

Buried Metal Line (BML) Architecture 504,504B

| Core_7A | Wdx7 | Core_7B |
| --- | --- | --- |
| Q3 IO_3A | Ctrl3 | IO_3B |
| Core_6A | Wdx6 | Core_6B |
| Core_5A | Wdx5 | Core_5B |
| Q2 IO_2A | Ctrl2 | IO_2B |
| Core_4A | Wdx4 | Core_4B |
| Core_3A | Wdx3 | Core_3B |
| Q1 IO_1A | Ctrl1 | IO_1B |
| Core_2A | Wdx2 | Core_2B |
| Core_1A | Wdx1 | Core_1B |
| Q0 IO_0A | Ctrl0 | IO_0B |
| Core_0A | Wdx0 | Core_0B |
| GIO_A | GCtrl | GIO_B |

Qout BML2

Clk, A<> BML1

FIG. 5B

BURIED METAL TECHNIQUES FOR MEMORY APPLICATIONS

BACKGROUND

This section is intended to provide information relevant to understanding the various technologies described herein. As the section's title implies, this is a discussion of related art that should in no way imply that it is prior art. Generally, the related art may or may not be considered prior art. It should therefore be understood that any statement in this section should be read in this light, and not as any admission of prior art.

In some memory architecture designs, conventional signal lines can be formed in memory, wherein metal signal lines can be disposed over the substrate, and these frontside lines can also be used as power rails for voltage distribution across the substrate. However, in conventional memory designs, memory cells typically use these frontside signal lines for voltage distribution to other frontside circuitry including the memory cells. Unfortunately, conventional memory designs are inefficient in that use of frontside signal lines in memory cells suffers from area penalty in fabrication. There exists a need to improve conventional memory designs so as to improve area efficiency of modern memory architecture.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 1 illustrates a schematic diagram of buried metal line (BML) architecture in accordance with various implementations described herein.

FIGS. 3A, 3B1-3B2, 3C, 3D1-3D2, 3E and 3F1-3F2 illustrate various schematic diagrams of buried metal line (BML) architecture in accordance with various implementations described herein.

FIGS. 4A-4B illustrate various schematic diagrams of buried metal line (BML) architecture in accordance with various implementations described herein.

FIGS. 5A-5B illustrate various schematic diagrams of buried metal line (BML) architecture in accordance with various implementations described herein.

DETAILED DESCRIPTION

Figure 2A:
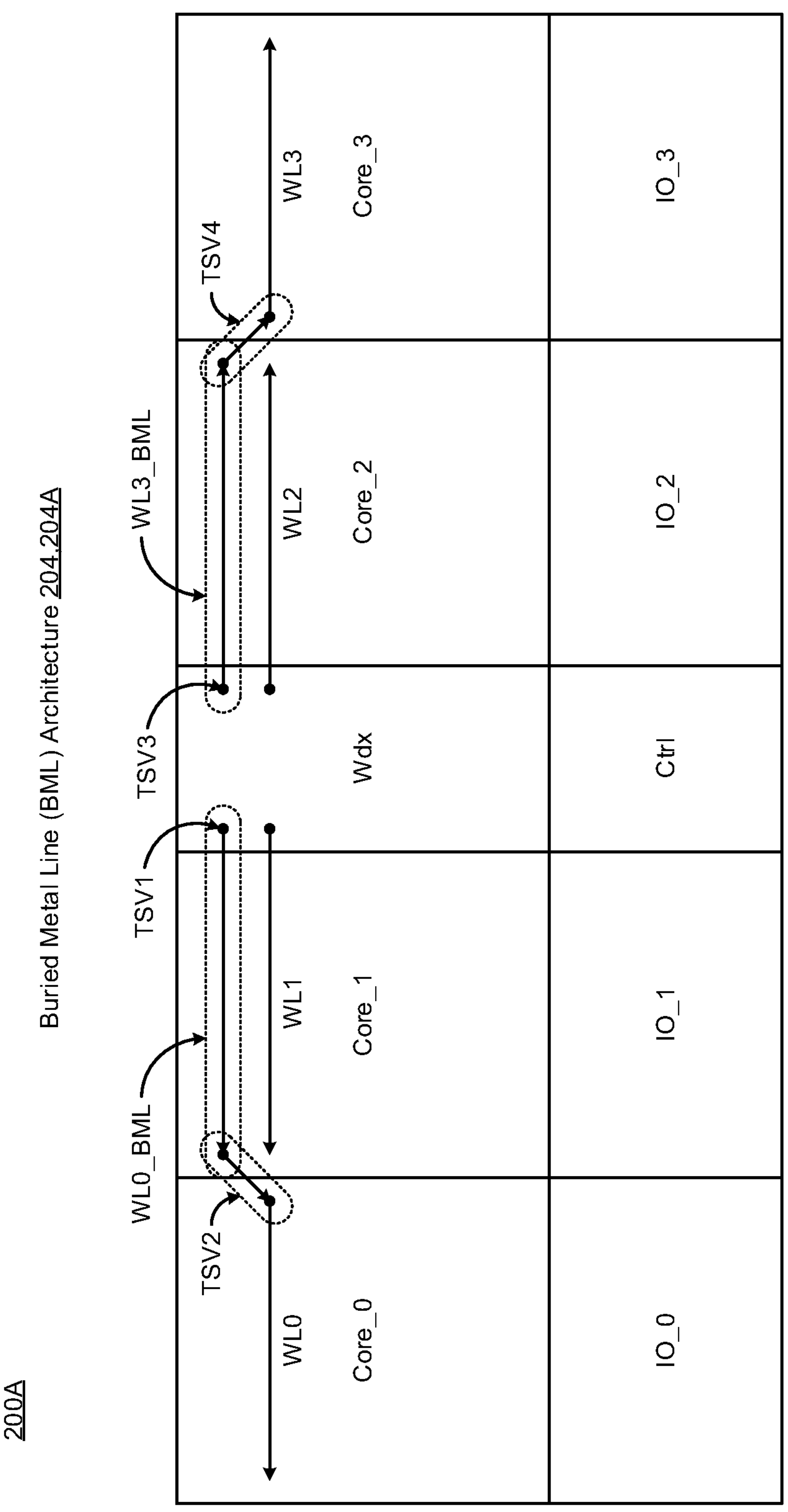
FIGS. 2A-2B illustrate various schematic diagrams of buried metal line (BML) architecture in accordance with various implementations described herein.

Various implementations described herein are directed to memory architecture having buried metal lines (BML) and/or backside metal lines (BSML) and/or interconnects in physical layout design. Thus, various buried metal line (BML) schemes and techniques described herein provide for buried metal line (BML) architecture that utilizes buried metal for signal routing in memory applications. In various applications, the buried metal line (BML) architecture provides for left-right enable signals (LREN) in various memory configurations (e.g., 4-way and 8-way Left-Right Enable), global signals in various multi-bank memory configurations (e.g., 4-bank and 8-bank) along with wordline re-buffer circuitry in memory layout designs, such as, e.g., static random access memory (SRAM) designs, using backside buried metal lines, interconnects and/or rails for routing core array signals, control signals and input-output (IO) signals. Thus, in some configurations, the novel buried metal line (BML) architecture described herein may use buried backside metal for efficient backside signal routing in memory applications, and the buried metal line (BML) architecture described herein provides a smaller cell boundary so as to reduce area impact and also to improve the timing and performance of memory. As such, various implementations described herein may provide for signal routings that are routed in buried metal lines/interconnects and/or backside metal lines/interconnects such that buried metal lines refer to usage of buried metal lines or backside metal lines/interconnects. Also, in some applications, multi-bank memory may be referred to as multi-page memory.

In some implementations, the various buried backside metal line schemes and techniques described herein may utilize the buried backside metal to provide substantially low resistance. Also, various buried metal line (BML) schemes and techniques described herein provide for buried metal line (BML) architecture that improves LREN4/8 (4-way and 8-way Left-Right Enable), wordline WL re-buffer and multi-bank (FB8) implementation in SRAM using buried backside metal lines for signal routing. Thus, the various buried metal line (BML) schemes and techniques described herein assist with gaining area in physical memory layout designs, and improve performance for wordline re-buffer designs. Further, the various buried metal line (BML) schemes and techniques described herein assist with the realization of LREN8 and FB8 SRAMs, which is typically not possible when using only conventional frontside metals for signal routing in modern memory designs.

In some implementations, the various buried backside metal line schemes and techniques described herein may provide for random access memory (RAM) applications including static RAM (SRAM). Therefore, various implementations described herein may provide for a novel cell architecture that utilizes buried metal for critical signals in SRAM applications. In reference to backside power domains for SRAM technology, metallization may be provided frontside (e.g., above a device) and also backside (e.g., below a device) as buried metal lines and/or backside metal lines/interconnects. Also, in logic domains, the buried metal lines and/or backside metal lines/interconnects may be used to supply power to memory components in a core array such that power domains are used to avoid area penalty. Various implementations described herein may also provide for an overall power domain scheme for memory applications, including, e.g., various use of backside-to-frontside transition cells having transition vias. These aspects along with various other features and characteristics are described in greater detail herein.

Various implementations of buried metal line (BML) architecture in association with related schemes and techniques for memory applications will be described in greater detail herein with reference to FIGS. 1, 2A-2B, 3A-3E, 4A-4B and 5A-5B.

FIG. 1 illustrates a diagram 100 of buried metal line (BML) architecture 104 in accordance with various implementations described herein. In various applications, the buried backside metal lines in memory refers to a buried metal line (BML) that is buried in the shallow trench isolation (STI) oxide and/or silicon (Si) substrate, and the buried metal lines (BML) and/or backside metal lines/interconnects may be utilized for routing signal lines, distributing voltage on power rails, or providing signal interconnects, such as, e.g., through-silicon vias (TSV). In some applications, buried metal lines and/or interconnects may refer to metal lines that are buried in silicon, oxides, substrates, oxide layers and/or similar types of structures. Also, in various other applications, backside metal lines and/or interconnects may be formed on the backside of a wafer, substrate or chip, such as, e.g., a silicon wafer and/or semiconductor substrate. Thus, various implementations described herein may provide for signal routings that are routed in buried metal lines/interconnects and/or backside metal lines/interconnects such that buried metal lines (BML) may refer to usage of buried metal lines or backside metal lines/interconnects.

In various implementations, the BML architecture 104 may be implemented as a system or a device having various integrated circuit (IC) components that are arranged and coupled together as an assemblage or combination of parts that provide for a physical circuit design and related structures. In some instances, a method of designing, providing and building the BML architecture 104 as an integrated system or device may involve use of various IC circuit components described herein to thereby implement buried backside metal line schemes and techniques associated therewith. The BML architecture 104 may be integrated with computing circuitry and related components on a single chip, and also, the BML architecture 104 may be implemented in various related embedded systems for automotive, electronic, mobile, server and Internet-of-things (IoT) applications.

As shown in FIG. 1, the BML architecture 104 may include frontside metal routing (FSMR) 108 having frontside signal lines coupled to various components and logic circuitry. In various applications, the frontside signal lines may be coupled to logic circuitry associated with frontside core array circuitry of bitcells that are arranged in columns and rows along with control circuitry and input-output (IO) circuitry. Also, in some applications, the frontside metal routing (FSMR) 108 may include a number (N) of frontside metal layers (e.g., FM0, FM1, FM2, . . . , FMN) along with frontside inter-layer vias (FSV).

As shown in FIG. 1, the BML architecture 104 may include backside metal routing (BSMR) 118 having backside signal lines coupled to various components and/or logic circuitry. In various applications, the backside signal lines may be coupled to various circuitry associated with backside signal routing in backside layout applications, including, e.g., wordline driver circuitry, control circuitry and input-output (IO) circuitry. Also, in some applications, the backside metal routing (BSMR) 118 may have a number (N) of backside metal layers (e.g., BM0, BM1, BM2, . . . , BMN) along with backside inter-layer vias (BSV) and backside power connection bumps (BSB).

In some implementations, the backside metal routing (BSMR) 118 may provide power distribution for memory components, logic and/or circuitry, such as, e.g., core array of bitcells, column multiplexer circuitry (CMUX), sense amplifier circuitry (SA), bitline precharge circuitry (PC), powergate input/output (PG I/O) circuitry, and powergate control (PG_CNTL). Also, the backside metal routing (BSMR) 118 may be configured to provide power supply voltages in one or more voltage domains for various frontside components and/or circuitry. Also, the power distribution network (PDN) may be configured to supply core voltages, periphery voltages and/or ground related voltages.

Also, as shown in FIG. 1, the BML architecture 104 may include frontside-to-backside transition 114 having buried transition vias (BTV) or through-silicon vias (TSV) that are used for coupling the buried backside metal routing (BSMR) 118 to the frontside metal routing (FSMR) 108. The buried transition vias (BTV) may be configured to provide signal transitions between the backside metal routing (BSMR) 118 to the frontside metal routing (FSMR) 108. As such, in various applications, the BML architecture 104 may be configured to transition the backside signal lines of the BSMR 118 to the frontside signal lines of the FSMR 108, e.g., through a semiconductor (silicon) substrate or wafer so as to thereby provide metal signal line taps to the core memory from the backside metal routing (BSMR) 118. Also, in various applications, the buried transition vias (BTV) may be used to transition critical signal nets from backside signal lines to the core memory, including, e.g., various circuitry disposed frontside. The frontside-to-backside transition 114 may be referred to as buried transition architecture that may have backside-to-frontside transition cells with buried transition vias (BTV) or through-silicon vias (TSV) that provide a coupling transition between the BSMR 118 and the FSMR 108.

In some implementations, the buried metal line (BML) architecture 104 may be configured to operate as power distribution network architecture that utilizes backside buried metal layers in a backside power network for backside power rails and also uses frontside metal of a frontside power network for frontside power rails. The frontside metal routing (FSMR) may use frontside metal layers, and the backside metal routing (BSMR) may use backside buried metal layers that are disposed underneath the frontside metal layers of the frontside metal routing (FSMR). Also, F2B transition architecture 114 may refer to buried transition vias (BTV) or through-silicon vias (TSV) that disposed between backside buried metal layers of the backside metal routing (BSMR) and the frontside metal layers of the frontside metal routing (FSMR).

In various implementations, the buried metal line (BML) architecture 104 may refer to a novel cell architecture that provides buried metal for critical signal nets in some memory applications, such as, e.g., random access memory (RAM) including static RAM (SRAM). For instance, the novel cell architecture is configured to provide backside signal distribution for memory circuitry (e.g., SRAM), wherein metallization is provided frontside above the memory circuitry and also backside below the memory circuitry as buried metal lines (BML) for buried backside signal routing. The novel cell architecture may use buried metallization for backside-to-frontside transition cells that allows for backside distribution of critical signal nets and/or power to core array circuitry disposed frontside. Further, the buried backside signal lines for memory may be buried in the substrate and related oxide layers, and these buried metal lines may also be used as power rails for distributing power and/or used as signal lines for transmitting critical signal nets. These aspects and various other features, behaviors and characteristics related to power-gating cell architecture are described herein in reference to FIGS. 2A-2B, 3A-3E, 4A-4B and 5A-5B.

Figure 2B:
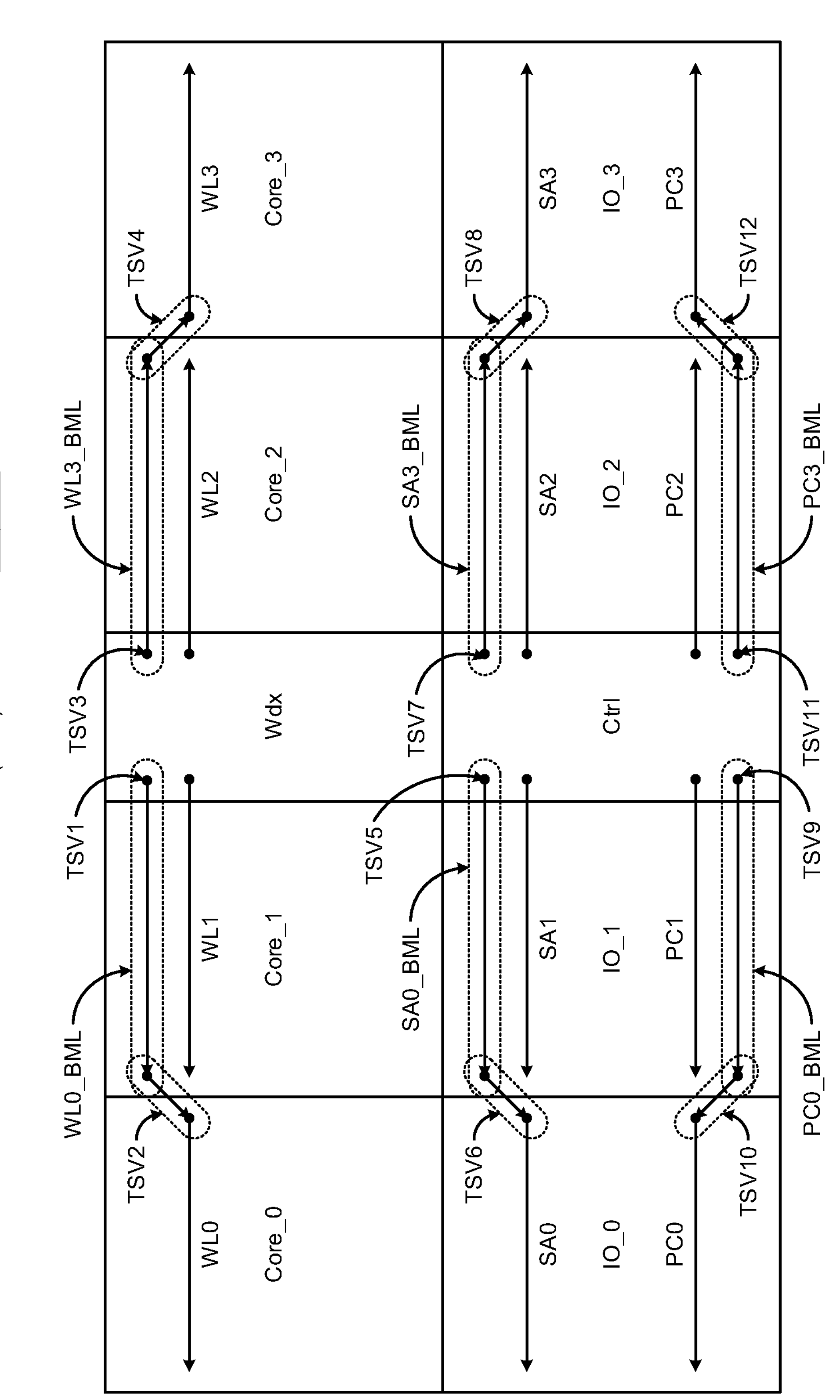

FIGS. 2A-2B illustrate various schematic diagrams of buried metal line (BML) architecture 204 in accordance with implementations described herein. In particular, FIG. 2A shows a diagram 200A of buried metal line (BML) architecture 204A that uses buried metal lines (BML) for backside signal routing of wordline (WL) signals, and FIG. 2B shows a diagram 200B of buried metal line (BML) architecture 204B that uses buried metal lines (BML) for backside signal routing of various other signals, such as, e.g., sense amplifier (sense-amp) signals (SA) and/or bitline precharge signals (PC).

In various implementations, the BML architecture 204 may be implemented as a system or a device having various integrated circuit (IC) components that are arranged and coupled together as an assemblage or combination of parts that provide for a physical circuit design and related structures. In some instances, a method of designing, providing and building the BML architecture 204 as an integrated system or device may involve use of various IC circuit components described herein to thereby implement buried backside metal line schemes and techniques associated therewith. The BML architecture 204 may be integrated with computing circuitry and related components on a single chip, and also, the BML architecture 204 may be implemented in various related embedded systems for automotive, electronic, mobile, server and Internet-of-things (IoT) applications.

As shown in FIG. 2A, the BML architecture 204A includes multi-page memory having multiple core arrays of bitcells including, e.g., a first core array (Core_0) of bitcells that are accessible via first wordlines (WL0) and a second core array (Core_1) of bitcells that are accessible via second wordlines (WL1). Also, the BML architecture 204A includes wordline driver circuitry (Wdx) having wordline drivers that are coupled to the bitcells in the first core array (Core_0) via the first wordlines (WL0) and to the bitcells in the second core array (Core_1) via the second wordlines (WL1). Further, the BML architecture 204A includes buried metal lines (WL0_BML) that are formed within the substrate, wherein the buried metal lines (WL0_BML) are utilized to couple the wordline drivers in the wordline driver circuitry (Wdx) to the first wordlines (WL0). Also, in some applications, the wordline drivers in Wdx are coupled to the WL0_BMLs by way of through-silicon vias (TSV1), and the WL0_BMLs are then coupled to WL0s by way of TSV2s.

As shown in FIG. 2A, the BML architecture 204A includes multi-page memory having multiple core arrays of bitcells including, e.g., a third core array (Core_2) of bitcells that are accessible via third wordlines (WL2) and a fourth core array (Core_3) of bitcells that are accessible via fourth wordlines (WL3). Also, the BML architecture 204A includes wordline driver circuitry (Wdx) having wordline drivers that are coupled to the bitcells in the third core array (Core_2) via the third wordlines (WL2) and to the bitcells in the fourth core array (Core_3) via the fourth wordlines (WL3). Further, the BML architecture 204A includes buried metal lines (WL3_BML) that are formed within the substrate, wherein the buried metal lines (WL3_BML) are utilized to couple the wordline drivers in the wordline driver circuitry (Wdx) to the fourth wordlines (WL3). Also, in some applications, wordline drivers in Wdx are coupled to the WL3_BMLs by way of through-silicon vias (TSV3), and the WL3_BMLs are then coupled to WL3s by way of TSV4s.

In various implementations, the bitcells and the wordline drivers are formed and disposed on the substrate above the buried metal lines (WL0_BML, WL3_BML) that are formed within the substrate, and the wordlines (WL0, WL1, WL2, WL3) may be formed in frontside metal layers above the substrate. Also, in various applications, the buried metal lines (WL0_BML, WL3_BML) may be formed within the substate underneath the bitcells, the wordlines (WL0, WL1, WL2, WL3) and the wordline drivers in Wdx. Further, in various applications, the wordlines (WL0, WL1, WL2, WL3) may refer to frontside wordlines that are formed and disposed above the substrate, and also, the buried wordlines (WL0_BML, WL3_BML) may refer to buried backside metal lines that are used to couple the Wdx to their corresponding frontside wordlines (WL0, WL3), respectively.

In various implementations, the buried metal lines (WL0_BML) may be used to route first wordline signals from the wordline drivers in Wdx to the bitcells in the first core array (Core_0) via the first wordlines (WL0), and further, the second wordlines (WL1) may be used to route second wordline signals from the wordline drivers in Wdx to the bitcells in the second core array (Core_1). Also, the third wordlines (WL2) may be used to route second wordline signals from the wordline drivers in Wdx to the bitcells in the third core array (Core_2), and also, the buried metal lines (WL3_BML) may be used to route fourth wordline signals from the wordline drivers in Wdx to the bitcells in the fourth core array (Core_3) via the fourth wordlines (WL3).

As shown in FIG. 2A, the BML architecture 204A includes control circuitry (Ctrl) and input-output circuitry (IO), wherein the control circuitry (Ctrl) may be configured to provide sense-amp enable signals (SA or SAEN) and/or bitline precharge signals (PC or BLPRECH) to input-output circuitry (IO) for each core array of bitcells. For instance, in some applications, the control circuitry (Ctrl) may provide sense-amp enable signals (SA) and/or bitline precharge signals (PC) to first input-output circuitry (IO_0) for the first core array of bitcells (Core_0), and the control circuitry (Ctrl) may provide sense-amp enable signals (SA) and/or bitline precharge signals (PC) to second input-output circuitry (IO_1) for the second core array of bitcells (Core_1). Also, the control circuitry (Ctrl) may provide sense-amp enable signals (SA) and/or bitline precharge signals (PC) to third input-output circuitry (IO_2) for the third core array of bitcells (Core_2), and also, the control circuitry (Ctrl) may provide sense-amp enable signals (SA) and/or bitline precharge signals (PC) to fourth input-output circuitry (IO_3) for the fourth core array of bitcells (Core_3).

In some implementations, as shown in FIG. 2B, the BML architecture 204B includes the control circuitry (Ctrl) that is configured to provide sense-amp enable signals (SA0, SA1) to the first input-output circuitry (IO_0) for the first core array (Core_0) and to the second input-output circuitry (IO_1) for the second core array (Core_1). The buried metal lines (SA0_BML) may be used to couple the control circuitry (Ctrl) to the first input-output circuitry (IO_0), and frontside metal lines (SA1) may be used to couple the control circuitry (Ctrl) to the second input-output circuitry (IO_1). Further, the buried metal lines (SA0_BML) may be used to route first sense-amp signals from the control circuitry (Ctrl) to the first input-output circuitry (IO_0), and also, the frontside metal lines (SA1) may be used to route second sense-amp signals from the control circuitry (Ctrl) to the second input-output circuitry (IO_1).

In some implementations, as shown in FIG. 2B, the BML architecture 204B includes the control circuitry (Ctrl) that provides sense-amp enable signals (SA2, SA3) to the third input-output circuitry (IO_2) for the third core array (Core_2) and also to the fourth input-output circuitry (IO_3) for the fourth core array (Core_3). The frontside metal lines (SA2) are used to couple the control circuitry (Ctrl) to the third input-output circuitry (IO_2), and the buried metal lines (SA3_BML) are used to couple the control circuitry (Ctrl) to the fourth input-output circuitry (IO_3). The frontside metal lines (SA2) are used to route third sense-amp signals from the control circuitry (Ctrl) to the third input-output circuitry (IO_2), and the buried metal lines (SA3_BML) are used to route fourth sense-amp signals from the control circuitry (Ctrl) to the fourth input-output circuitry (IO_3).

Also, in various applications, the sense-amp lines (SA0, SA1, SA2, SA3) may refer to frontside sense-amp lines that are formed and disposed above the substrate, and also, the buried sense-amp lines (SA0_BML, SA3_BML) may refer to buried backside metal lines that are used to couple the Ctrl to their corresponding frontside sense-amp lines (SA0, SA3), respectively. Also, the Ctrl is coupled to the SA0_BMLs by way of through-silicon vias (TSV5), and the SA0_BMLs are then coupled to SA0s by way of TSV6s. Further, the Ctrl is coupled to the SA3_BMLs by way of through-silicon vias (TSV7), and the SA0_BMLs are then coupled to SA3s by way of TSV8s.

In various implementations, as shown in FIG. 2B, the BML architecture 204B includes the control circuitry (Ctrl) that is configured to provide bitline precharge signals (PC0, PC1) to the first input-output circuitry (IO_0) for the first core array (Core_0) and to the second input-output circuitry (IO_1) for the second core array (Core_1). The buried metal lines (PC0_BML) may be used to couple the control circuitry (Ctrl) to the first input-output circuitry (IO_0), and frontside metal lines (PC1) may be used to couple the control circuitry (Ctrl) to the second input-output circuitry (IO_1). Further, the buried metal lines (PC0_BML) may be used to route first bitline precharge signals from the control circuitry (Ctrl) to the first input-output circuitry (IO_0), and also, the frontside metal lines (PC1) may be used to route second bitline precharge signals from the control circuitry (Ctrl) to the second input-output circuitry (IO_1).

In some implementations, as shown in FIG. 2B, the BML architecture 204B includes the control circuitry (Ctrl) that provides bitline precharge signals (PC2, PC3) to the third input-output circuitry (IO_2) for the third core array (Core_2) and also to the fourth input-output circuitry (IO_3) for the fourth core array (Core_3). The frontside metal lines (PC2) are used to couple the control circuitry (Ctrl) to the third input-output circuitry (IO_2), and the buried metal lines (PC3_BML) are used to couple the control circuitry (Ctrl) to the fourth input-output circuitry (IO_3). The frontside metal lines (PC2) are used to route third bitline precharge signals from the control circuitry (Ctrl) to the third input-output circuitry (10_2), and the buried metal lines (PC3_BML) are used to route fourth bitline precharge signals from the control circuitry (Ctrl) to the fourth input-output circuitry (IO_3).

Also, in various applications, the bitline precharge lines (PC0, PC1, PC2, PC3) refer to frontside bitline precharge lines that are formed and disposed above the substrate, and further, the buried bitline precharge lines (PC0_BML, PC3_BML) may refer to buried backside metal lines that are used to coupled Ctrl to their corresponding frontside bitline precharge lines (PC0, PC3), respectively. Also, the Ctrl is coupled to the PC0_BMLs by way of through-silicon vias (TSV9), and the PC0_BMLs are then coupled to PC0s by way of TSV10s. Further, the Ctrl is coupled to the PC3_BMLs by way of through-silicon vias (TSV11), and the PC0_BMLs are then coupled to PC3s by way of TSV12s.

Figure 3A:
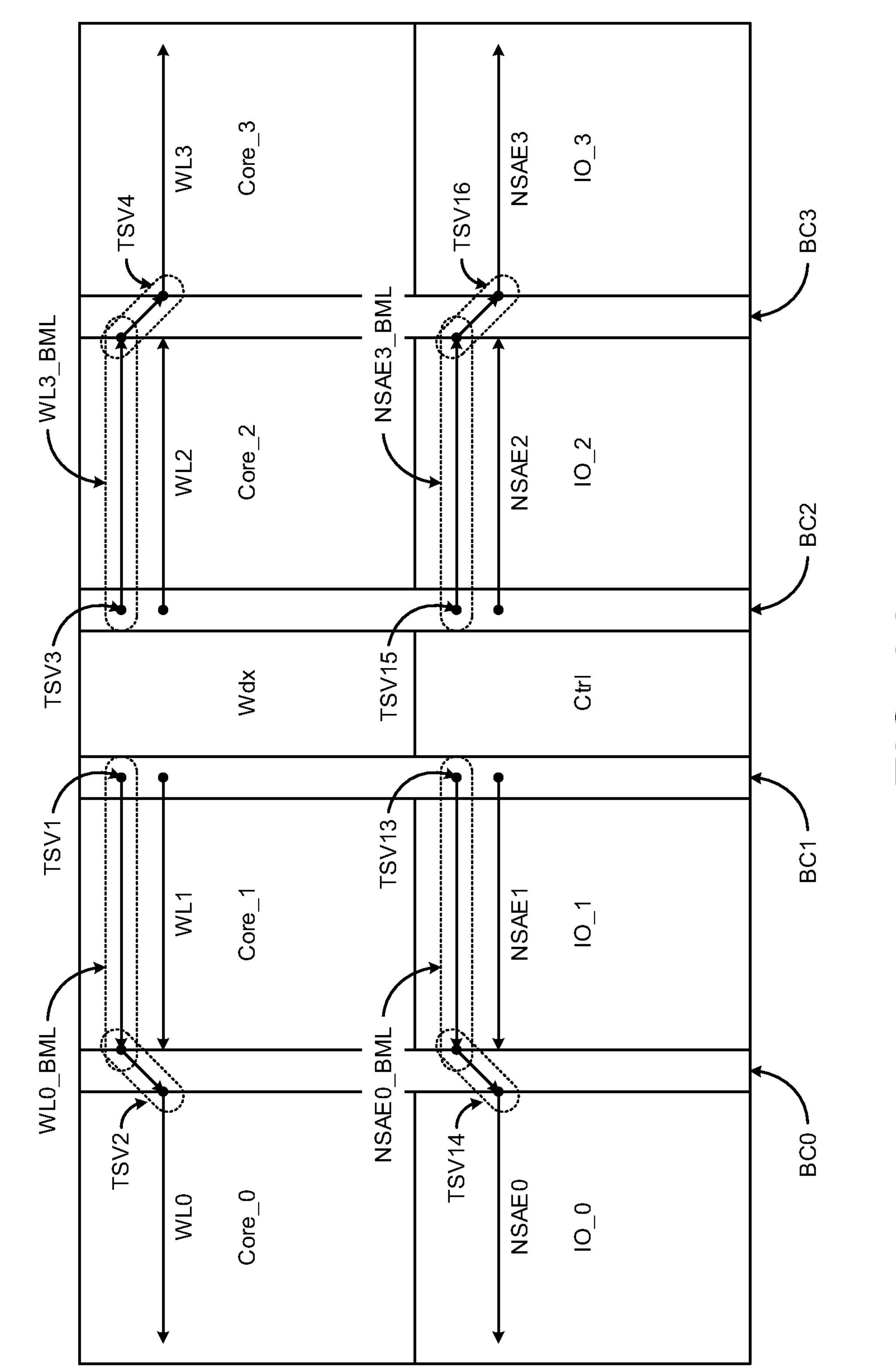
Figure 3C:
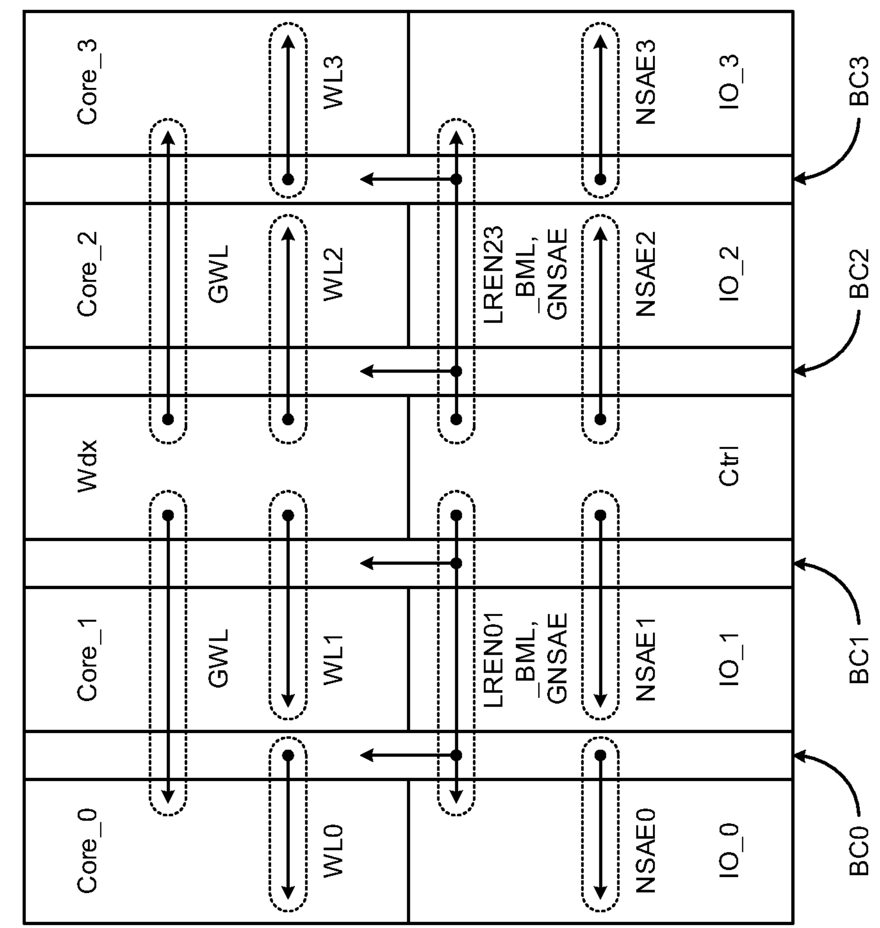
Figure 3E:
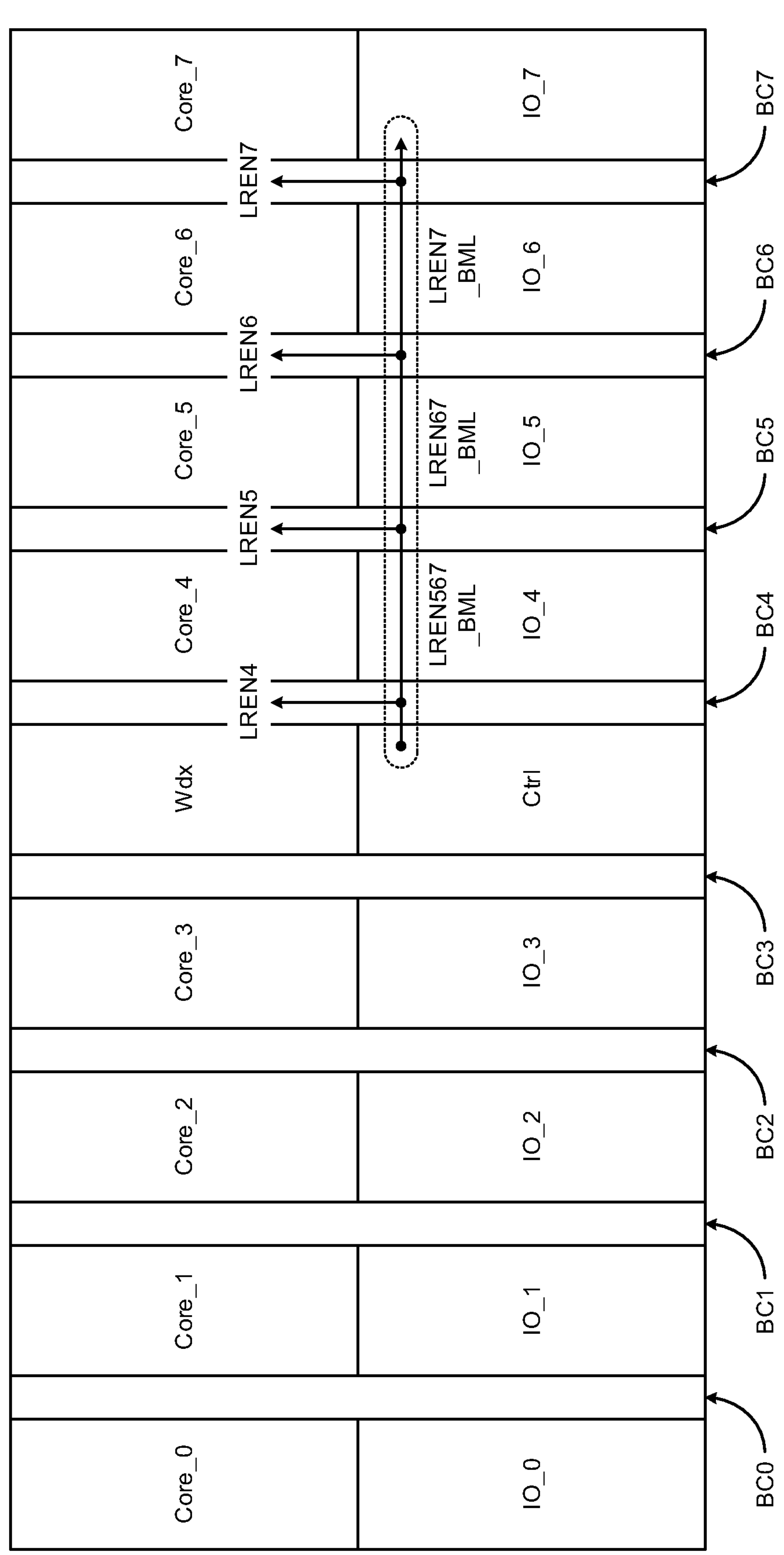

FIGS. 3A, 3B1-3B2, 3C, 3D1-3D2, 3E, 3F1-3F2 illustrate schematic diagrams of buried metal line (BML) architecture 304 in accordance with various implementations described herein. In particular, FIG. 3A shows a diagram 300A of buried metal line (BML) architecture 304A that uses buried metal lines (BML) for backside signal routing of various signals, FIGS. 361-362 show diagrams 300B1-300B2 of buried metal line (BML) architecture 304B1-304B2 that use break-cell (BC) logic circuitry for controlling backside signal routing of various signals, FIG. 3C shows a diagram 300C of buried metal line (BML) architecture 304C that uses buried metal lines (BML) for backside signal routing of various signals, FIGS. 3D1-3D2 show diagrams 300D1-300D2 of buried metal line (BML) architecture 304D1-304D2 that use break-cell (BC) logic circuitry for controlling backside signal routing of various signals, and FIG. 3E shows a diagram 300E of buried metal line (BML) architecture 304E that uses buried metal lines (BML) for backside signal routing of various signals, and FIGS. 3F1-3F2 show diagrams 300F1-300F2 of buried metal line (BML) architecture 304F1-304F2 that use break-cell (BC) logic circuitry for controlling backside signal routing of various signals.

In various implementations, the BML architecture 304 may be implemented as a system or a device having various integrated circuit (IC) components that are arranged and coupled together as an assemblage or combination of parts that provide for a physical circuit design and related structures. In some instances, a method of designing, providing and building the BML architecture 304 as an integrated system or device may involve use of various IC circuit components described herein to thereby implement buried backside metal line schemes and techniques associated therewith. The BML architecture 304 may be integrated with computing circuitry and related components on a single chip, and also, the BML architecture 304 may be implemented in various related embedded systems for automotive, electronic, mobile, server and Internet-of-things (IoT) applications.

As shown in FIG. 3A, the BML architecture 304A includes multi-page memory having multiple core arrays of bitcells including the core arrays (Core_0, Core_1, Core_2, Core_3) of bitcells that are accessible via wordlines (WL0, WL1, WL2, WL3) and buried wordlines (WL0_BML, WL3_BML), as described herein. Also, the BML architecture 304A includes wordline driver circuitry (Wdx) having the wordline drivers that are coupled to the bitcells in core arrays (Core_0, Core_1, Core_2, Core_3) via wordlines (WL0, WL1, WL2, WL3) and buried wordlines (WL0_BML, WL3_BML). Also, the wordline drivers in the Wdx are coupled to WL0_BMLs, WL3_MBLs by way of TSV1s, TSV3s, and the WL0_BMLs, WL3_BMLs are then coupled to WL0s, WL3s by way of TSV2s, TSV4s.

As shown in FIG. 3A, the BML architecture 304A includes the control circuitry (Ctrl) and input-output circuitry (IO), wherein the control circuitry (Ctrl) may be configured to provide control signals (NSAE1, NSAE2, NSAE3, NSAE4) to input-output circuitry (IO) for the core array of bitcells. For instance, in some applications, the control circuitry (Ctrl) may provide sense amplifier enable signals (NSAE1, NSAE2) to the input-output circuitry (IO_0, IO_1) for the core array of bitcells (Core_0, Core_1), respectively, and in addition, the control circuitry (Ctrl) may provide sense amplifier enable signals (NSAE3, NSAE4) to the input-output circuitry (IO_2, IO_3) for the core array of bitcells (Core_2, Core_3), respectively.

Also, the BML architecture 304A includes the wordline driver circuitry (Wdx), wherein the wordline driver circuitry (Wdx) may be configured to provide Wdx signals (WL0, WL1, WL2, WL3) to the input-output circuitry (IO) for the core array of bitcells. For instance, in some applications, the wordline driver circuitry (Wdx) may provide Wdx signals (WL0, WL1) to the input-output circuitry (IO_0, IO_1) for the core array of bitcells (Core_0, Core_1), respectively, and in addition, the wordline driver circuitry (Wdx) may provide Wdx signals (WL2, WL3) to the input-output circuitry (IO_2, IO_3) for the core array of bitcells (Core_2, Core_3), respectively.

In various implementations, as shown in FIG. 3A, the BML architecture 304A may include break-cell circuitry (BC0, BC1, BC2, BC3) that is disposed between the core arrays of bitcells (Core_0, Core_1, Core_2, Core_3), the wordline driver circuitry (Wdx), and the control circuitry (Ctrl). For instance, in some applications, first break-cell circuitry (BC0) may be disposed between the first core array (Core_0) and the second core array (Core_1), and second break-cell circuitry (BC1) may be disposed between the second core array (Core_1) and Wdx/Ctrl. Also, third break-cell circuitry (BC2) may be disposed between Wdx/Ctrl and third core array (Core_2), and fourth break-cell circuitry (BC3) may be disposed between third core array (Core_2) and fourth core array (Core_3).

Also, the break-cell circuitry (BC1) receives a clock signal and an enable signal from the control circuitry (Ctrl) and then provides a wordline enable signal to the first core array (Core_0) and/or the second core array (Core_1), wherein the buried metal lines (NSAE0_BML) are used to couple the control circuitry (Ctrl) to the break-cell circuitry (BC0, BC1), and also, the buried metal lines (NSAE0_BML) are used to route the enable signal from the control circuitry (Ctrl) to the break-cell circuitry (BC0, BC1).

Also, the break-cell circuitry (BC2) receives a clock signal and an enable signal from the control circuitry (Ctrl) and then provides a wordline enable signal to the third core array (Core_2) and/or the fourth core array (Core_3), wherein the buried metal lines (NSAE1_BML) are used to couple the control circuitry (Ctrl) to the break-cell circuitry (BC2, BC3), and also, the buried metal lines (NSAE1_BML) are used to route the enable signal from the control circuitry (Ctrl) to the break-cell circuitry (BC2, BC3).

Also, in some applications, the Ctrl is coupled to the NSAE0_BMLs by way of through-silicon vias (TSV13), and the NSAE0_BMLs are then coupled to NSAE0s by way of TSV14s. Also, the Ctrl is coupled to the NSAE3_BMLs by way of through-silicon vias (TSV15), and the NSAE0_BMLs are then coupled to NSAE3s by way of TSV16s.

As shown in FIG. 361, the BML architecture 304B1 includes the wordline driver circuitry (Wdx) that is configured to provide various timing-enable signals, including, e.g., global wordline signals (GWL) and left-right enable signals (LREN0, LREN1, LREN2, LREN3), to break-cell logic (L1, L2, . . . , L8) in break-cell circuitry (BC1, BC2). In some applications, Wdx provides GWL and LREN0 signals to wordlines (WL0) on Core_0 by way of series-coupled logic gates (L1, L2) in BC1, TSV1s in BC1, buried wordlines (WL0_BML) under Core_1, and TSV2s in BC0. Also, Wdx provides GWL and LREN1 signals to wordlines (WL1) in Core_1 by way of series-coupled logic gates (L3, L4) in BC1. Also, Wdx provides GWL and LREN2 signals to wordlines (WL2) in Core_2 by way of series-coupled logic gates (L5, L6) in BC2. Also, Wdx provides GWL and LREN3 signals to wordlines (WL3) in Core_3 by way of series-coupled logic gates (L7, L8) in BC2, TSV3s in BC2, buried wordlines (WL0_BML) underneath Core_2, and TSV4s in BC3.

As shown in FIG. 3B2, the BML architecture 304B2 includes control circuitry (Ctrl) that is configured to provide various timing-enable signals, including, e.g., global sense amplifier enable signals (GNSAE) and left-right enable signals (LREN0, LREN1, LREN2, LREN3), to break-cell logic (L1, L2, . . . , L8) in break-cell circuitry (BC1, BC2). In some applications, the control circuitry (Ctrl) provides the GNSAE and LREN0 signals to sense amp lines (NSAE0) on Core_0 by way of series-coupled logic gates (L1, L2) in BC1, TSV1s in BC1, buried sense amp lines (NSAE0_BML) under Core_1, and TSV2s in BC0. Also, Ctrl provides GNSAE and LREN1 signals to sense amp lines (NSAE1) in Core_1 by way of series-coupled logic gates (L3, L4) in BC1. Also, Ctrl provides GNSAE and LREN2 signals to sense amp lines (NSAE2) in Core_2 by way of series-coupled logic gates (L5, L6) in BC2. Also, Ctrl provides GNSAE and LREN3 signals to sense amp lines (NSAE3) in Core_3 by way of series-coupled logic gates (L7, L8) in BC2, TSV3s in BC2, buried sense amp lines (NSAE0_BML) underneath Core_2, and TSV4s in BC3.

As shown in FIG. 3C, the BML architecture 304B includes the control circuitry (Ctrl) that is configured to provide various control signals, including, e.g., left-right enable signals (LREN01, LREN23) and global sense amp signals (GNSAE), to break-cell circuitry (BC0, BC1, BC2, BC3). For instance, in some applications, control circuitry (Ctrl) provides left-right enable signals (LREN01) to break-cell circuitry (BC0, BC1) by way of TSVs and buried control lines (LREN01_BML), and also, control circuitry (Ctrl) provides left-right enable signals (LREN23) to break-cell circuitry (BC2, BC3) by way of TSVs and buried control lines (LREN23_BML).

Also, the BML architecture 304B includes wordline driver circuitry (Wdx) that is configured to provide various control signals, including, e.g., GWL, WL0, WL1, WL2, WL3, to break-cell circuitry (BC0, BC1, BC2, BC3). For instance, in some applications, the Wdx circuitry provides GWL, WL0, WL1 to break-cell circuitry (BC0, BC1) by way of TSVs and buried control lines (WL0_BML), and also, the Wdx circuitry provides GWL, WL2, WL3 to break-cell circuitry (BC2, BC3) by way of TSVs and buried control lines (WL3_BML).

As shown in FIG. 3D1, the BML architecture 304D1 includes the Wdx circuitry that is configured to provide various control signals, including, e.g., global wordline signals (GWL) and/or left-right enable signals (LREN2), to break-cell circuitry (BC2, BC3). For instance, in some applications, Wdx circuitry provides GWL and LREN2 signals to break-cell circuitry (BC2), and also, BC2 includes series-coupled logic gates (L11, L12) that receive the GWL and LREN2 signals in BC2 and provide local wordline signals (WL2) to Core_2. Also, Wdx circuitry provides GWL and LREN3_BML signals to break-cell circuitry (BC3) by way of TSVs and buried control lines (LREN3_BML) under 102, and also, BC3 includes series-coupled logic gates (L13, L14) that receive the GWL and LREN3_BML signals in BC3 and provide local wordline signals (WL3) to Core_3.

As shown in FIG. 3D2, the BML architecture 304D2 includes the control circuitry (Ctrl) that is configured to provide various control signals, including, e.g., global sense amp enable signals (GNSAE) and/or left-right enable signals (LREN2) to break-cell circuitry (BC2). For instance, in some applications, control circuitry (Ctrl) provides GWL and LREN2 signals to break-cell circuitry (BC2), and also, BC2 includes series-coupled logic gates (L11, L12) that receive the GWL and LREN2 signals in BC2 and provide local sense amp enable signals (NSAE2) to Core_2. Also, control circuitry (Ctrl) provides GWL and LREN3_BML signals to break-cell circuitry (BC3) by way of TSVs and buried control lines (LREN3_BML) under BC3, and also, BC3 includes series-coupled logic gates (L13, L14) that receive the GWL and LREN3_BML signals in 102 and provide local sense amp enable signals (NSAE3) to Core_3.

As shown in FIG. 3E, the BML architecture 304E includes the control circuitry (Ctrl) that is configured to provide various control signals, including, e.g., left-right enable signals (LREN567, LREN67, LREN7) to break-cell circuitry (BC4, BC5, BC6, BC7). For instance, in some applications, control circuitry (Ctrl) provides left-right enable signals (LREN567, LREN67, LREN7) to break-cell circuitry (BC4, BC5, BC6, BC7) by way of TSVs and buried control lines (LREN567_BML, LREN67_BML, LREN7_BML).

As shown in FIG. 3F1, the BML architecture 304F1 includes the Wdx circuitry that is configured to provide various control signals, including, e.g., global wordline signals (GWL) and/or left-right enable signals (LREN5_BML), to break-cell circuitry (BC2). For instance, in some applications, Wdx circuitry provides GWL and LREN5_BML signals to break-cell circuitry (BC2), and also, BC2 includes series-coupled logic gates (L11, L12) that receive the GWL and LREN5_BML signals in BC2 and provide local wordline signals (WL5) to Core_5.

As shown in FIG. 3F2, the BML architecture 304F2 includes the control circuitry (Ctrl) that is configured to provide various control signals, including, e.g., global sense amp enable signals (GNSAE) and/or left-right enable signals (LREN5_BML) to break-cell circuitry (BC2). For instance, in some applications, the control circuitry (Ctrl) provides GWL and LREN5_BML signals to break-cell circuitry (BC2), and also, BC2 includes series-coupled logic gates (L13, L14) that receive the GWL and LREN5_BML signals in BC2 and provide local sense amp enable signals (NSAE5) to Core_5.

Figure 4A:
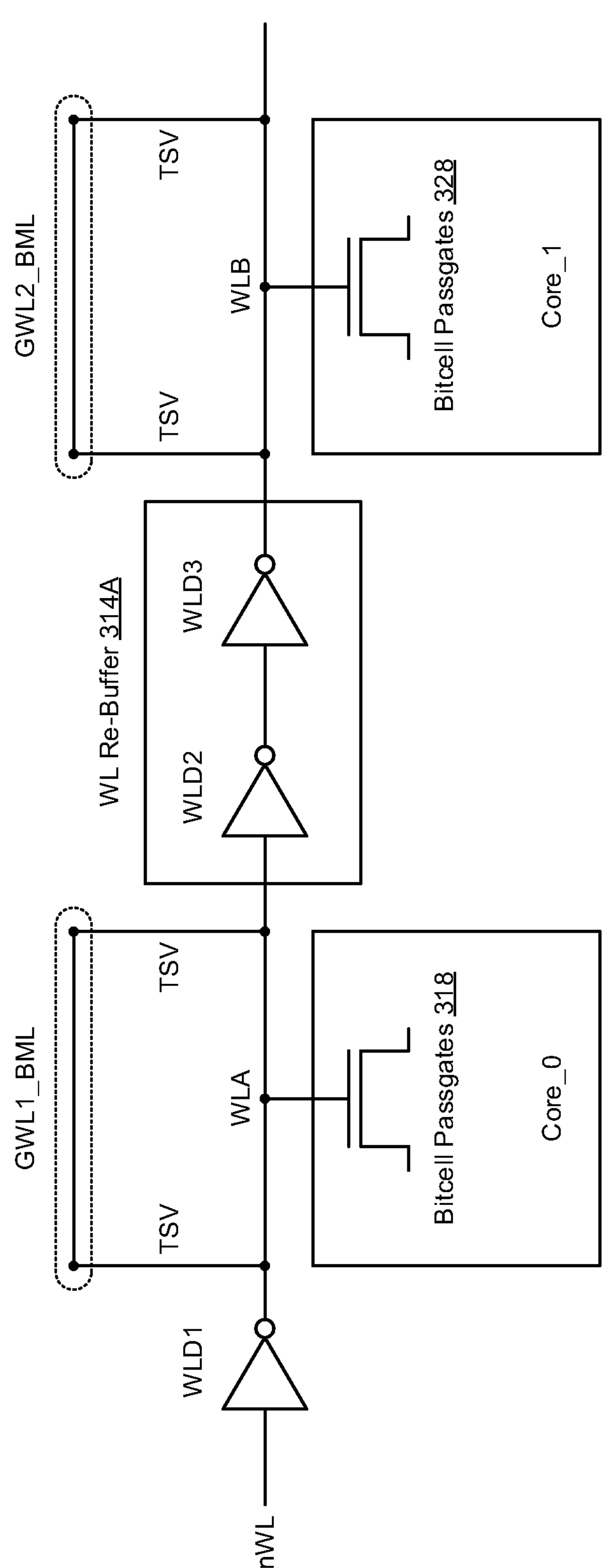

FIGS. 4A-4B illustrate various schematic diagrams of buried metal line (BML) architecture 404 in accordance with implementations described herein. In particular, FIG. 4A shows a diagram 400A of buried metal line (BML) architecture 404A having wordline re-buffer circuitry 314A in a first configuration, and also, FIG. 4B shows another diagram 400B of buried metal line (BML) architecture 404B having wordline re-buffer circuitry 314B in a second configuration.

In various implementations, the BML architecture 404 may be implemented as a system or a device having various integrated circuit (IC) components that are arranged and coupled together as an assemblage or combination of parts that provide for a physical circuit design and related structures. In some instances, a method of designing, providing and building the BML architecture 404 as an integrated system or device may involve use of various IC circuit components described herein to thereby implement buried backside metal line schemes and techniques associated therewith. The BML architecture 404 may be integrated with computing circuitry and related components on a single chip, and also, the BML architecture 404 may be implemented in various related embedded systems for automotive, electronic, mobile, server and Internet-of-things (IoT) applications.

As shown in FIG. 4A, the BML architecture 404A may include wordline driver (WLD1) coupled in series along wordline (nWL) to series-coupled wordline drivers (WLD2, WLD3) of wordline re-buffer 314A. Also, the wordline (nWL) is coupled to bitcell passgates 318 in Core_0 and to bitcell passgates 328 in Core_1. In some implementations, the BML architecture 404A may include buried global wordlines (GWL1_BML, GWL2_BML) that are coupled to wordline (WL). For instance, in various applications, buried global wordline (GWL1_BML) is coupled to the wordline (nWL) between WLD1 and WLD2 in association with Core_0, and wherein buried global wordline (GWL2_BML) is coupled to the wordline (nWL) after WLD3 in association with Core_1.

As shown in FIG. 4B, the BML architecture 404B may include wordline driver (WLD1) coupled in series along wordline (nWL) to series-coupled wordline drivers (WLD2, WLD3) of wordline re-buffer 314A. Also, the wordline (nWL) is coupled to bitcell passgates 318 in Core_0 and to bitcell passgates 328 in Core_1. In some implementations, the BML architecture 404A may include global wordline driver (GWLD) coupled to the buried global wordline (GWL1_BML) and wordline (WL), and the BML architecture 404A may include buried global wordline (GWL2_BML) coupled to the wordline (WL). For instance, in some applications, wordline (nWL) has an open-break 334 after bitcell passgates 318 and before WLD2, and also, the global wordline driver (GWLD) is coupled to the wordline (nWL) before WLD1 and before WLD2, and also, GWLD receives the wordline signal from the wordline (nWL) and provides GWL1 signal to WLD2 by way of buried global wordline (GWL1). Also, the buried global wordline (GWL2_BML) may be coupled to the wordline (nWL) after WLD3 and in association with Core_1.

In some implementations, the BML architecture 404A, 404B includes multi-bank memory (Core_0, Core_1) having a first core array (Core_0) with bitcells accessible via first wordlines (WLA) and a second core array (Core_1) with bitcells accessible via second wordlines (WLB). Also, in some applications, multi-bank memory may be referred to as multi-page memory. The BML architecture 404A, 404B has first wordline drivers (WLD1) coupled to the bitcells in the first core array (Core_0) via the first wordlines (WLA), and the BML architecture 404A, 404B has second wordline drivers (WLD2, WLD3) in a WL re-buffer configuration coupled in series with the first wordline drivers (WLD1), and also, the second wordline drivers (WDL2, WDL3) may be coupled to the bitcells in the second core array (Core_1) via the second wordlines (WLB). Also, the BML architecture 404A, 404B may include buried metal lines (GWL1_BML, GWL2_BML) formed within a substrate, and also, the buried metal lines (GWL1_BML, GWL2_BML) may be used to couple the third wordlines (GWL1) in parallel to the first wordlines (WLA), and also, the buried metal lines (GWL1_BML, GWL2_BML) may be used to couple the fourth wordlines (GWL2) in parallel to the second wordlines (WLB).

In some implementations, the bitcells, the first wordline drivers (WLD1) and the second wordline drivers (WLD2, WLD3) are formed and disposed on the substrate above the buried metal lines (GWL1_BML, GWL2_BML) formed within the substrate. The first wordlines (WLA) and the second wordlines (WLB) are formed in frontside metal layers above the substrate. The buried metal lines (GWL1_BML, GWL2_BML) are formed within the substate underneath the bitcells, first wordlines (WLA), second wordlines (WLB), first wordline drivers (WLD1) and second wordline drivers (WLD2, WLD3).

In some implementations, the first wordlines (WLA) may be used to route first wordline signals from the first wordline drivers (WLD1) to the bitcells in the first core array (Core_0) and to the second wordline drivers (WLD2, WLD3). Also, the buried metal lines (GWL1_BML, GWL2_BML) are used to route first wordline signals from the first wordline drivers (WLD1) to second wordlines drivers (WLD2, WLD3). Also, the second wordlines (WLB)

are used to route second wordline signals from the second wordline drivers (WLD2, WLD3) to the bitcells in the second core array (Core_1). Further, the buried metal lines (GWL1_BML, GWL2_BML) are used to route second wordline signals (WLB) from second wordline drivers (WLD2, WLD3) to the bitcells in the second core array (Core_1).

In some implementations, as shown in FIG. 4B, third wordline drivers (GWLD) are coupled in parallel with the first wordline drivers (WLD1), and the open-break 334 may be formed in the first wordlines (WLA) and are used to decouple the first wordline drivers (WLD1) from the second wordline drivers (WLD2, WLD3). Also, the first wordlines (WLA) may be used to route first wordline signals from first wordline drivers (WLD1) to the bitcells in the first core array (Core_0), and also, buried metal lines (GWL1_BML, GWL2_BML) may be used to route the first wordline signals from first wordline drivers (WLD1) to second wordlines drivers (WLD2, WLD3). Further, second wordlines (WLB) may be used to route second wordline signals from second wordline drivers (WLD2, WLD3) to the bitcells in the second core array (Core_1), and also, the buried metal lines (GWL1_BML, GWL2_BML) may be used to route the second wordline signals from second wordline drivers (WLD2, WLD3) to the bitcells in the second core array (Core_1).

Figure 5A:
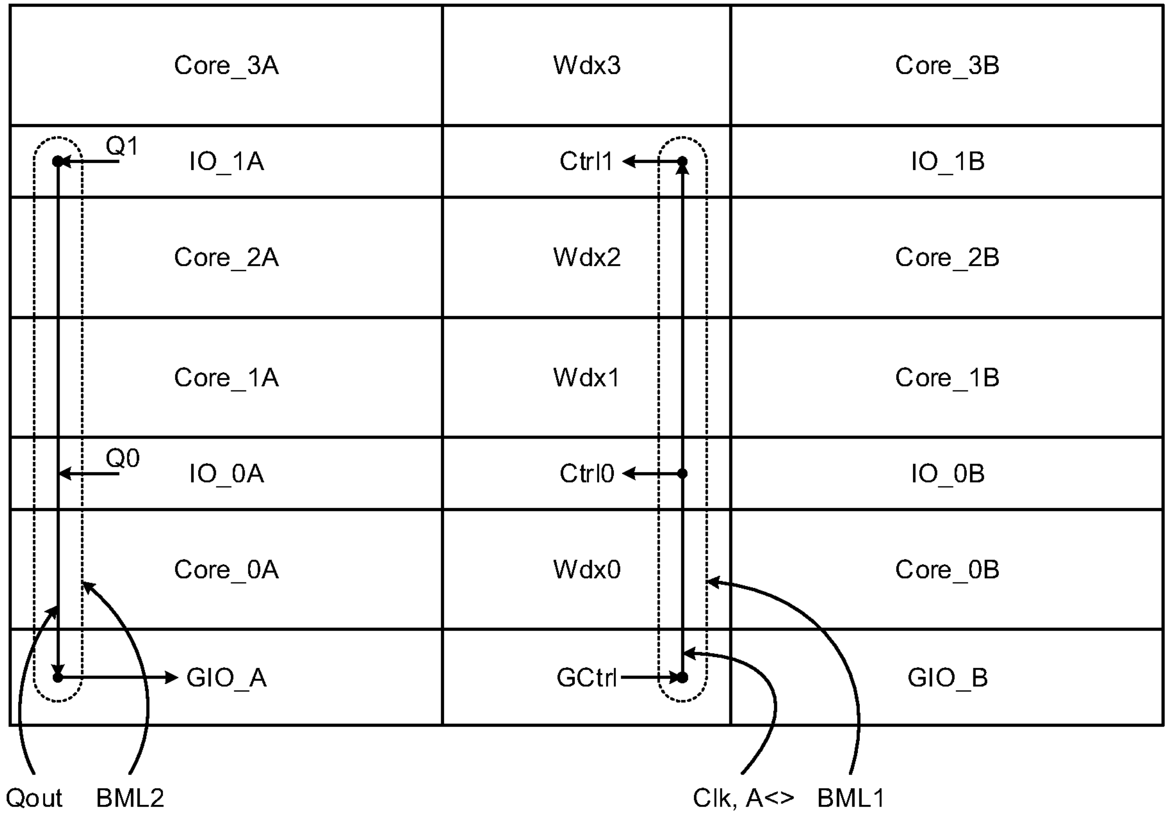

FIGS. 5A-5B illustrate various schematic diagrams of buried metal line (BML) architecture 504 in accordance with implementations described herein. In particular, FIG. 5A shows a diagram 500A of buried metal line (BML) architecture 504A with global control circuitry (GCtrl), and also, FIG. 5B shows another diagram 500B of buried metal line (BML) architecture 504B with global control circuitry (GCtrl).

In various implementations, the BML architecture 504 may be implemented as a system or a device having various integrated circuit (IC) components that are arranged and coupled together as an assemblage or combination of parts that provide for a physical circuit design and related structures. In some instances, a method of designing, providing and building the BML architecture 504 as an integrated system or device may involve use of various IC circuit components described herein to thereby implement buried backside metal line schemes and techniques associated therewith. The BML architecture 504 may be integrated with computing circuitry and related components on a single chip, and also, the BML architecture 504 may be implemented in various related embedded systems for automotive, electronic, mobile, server and Internet-of-things (IoT) applications.

As shown in FIG. 5A, the BML architecture 504A includes multi-bank memory having multiple core arrays of bitcells (Core_0A, Core_0B, Core_1A, Core_1B, Core_2A, Core_2B, Core_3A, Core_3B). Also, in some applications, multi-bank memory may be referred to as multi-page memory. Also, the BML architecture 504A has local control circuitry (Ctrl0, Ctrl1) that receive a clock signal (Clk) and an address signal (A< >) for accessing data stored in the bitcells of the multiple core arrays. Also, the BML architecture 504A has global control circuitry (GCtrl) that provides clock signal (Clk) and address signal (A< >) to the local control circuitry (Ctrl0, Ctrl1) by way of buried metal lines (BML1) formed within a substrate. The buried metal lines (BML1) may be used to couple the global control circuitry (GCtrl) to the local control circuitry (Ctrl0, Ctrl1).

In various implementations, the BML architecture 504A has local input-output circuitry (IO_0A, IO_06, IO_1A, IO_16) that receives accessed data from the bitcells of the multiple core arrays based on operations of the local control circuitry (Ctrl0, Ctrl1) using the clock signal (Clk) and the address signal (A< >). Further, the BML architecture 504A includes global input-output circuitry (GIO_A, GIO_B) that receives the accessed data from the local input-output circuitry (IO_0A, IO_06, IO_1A, IO_16) by way of the buried metal lines (BML2) formed within the substrate, and the buried metal lines (BML2) may be utilized to couple the local input-output circuitry (IO_0A, IO_06, IO_1A, IO_16) to the global input-output circuitry (GIO_A, GIO_B).

In various implementations, the bitcells, the local control circuitry (Ctrl0, Ctrl1) and the global control circuitry (GCtrl) may be formed and disposed on the substrate above the buried metal lines (BML1) formed within the substrate, and also, the buried metal lines (BML1) may be formed within the substate underneath the bitcells, the local control circuitry (Ctrl0, Ctrl1), and global control circuitry (GCtrl). Also, the local input-output circuitry (IO_0A, IO_06, IO_1A, IO_1B) and the global input-output circuitry (GIO_A, GIO_B) may be formed and disposed on the substrate above buried metal lines (BML2) formed within the substrate, and also, the buried metal lines (BML2) may be formed within the substate underneath the bitcells, the local input-output circuitry (IO_0A, IO_0B, IO_1A, IO_1B), and global input-output circuitry (GIO_A, GIO_B).

As shown in FIG. 5A, the multi-bank memory may be configured to have four core arrays of bitcells (Core_0, Core_1, Core_2, Core_3) in a first configuration. However, the multi-bank memory may be scaled, expanded and configured to have any number of core arrays of bitcells, such as, e.g., eight core arrays of bitcells (Core_0, Core_1, Core_2, Core_3, Core_4, Core_5, Core_6, Core_7) in a second configuration. Also, in some applications, multi-bank memory may be referred to as multi-page memory.

In various implementations, as shown in FIG. 5B, the BML architecture 504B may include multi-bank memory having multiple core arrays of bitcells (Core_0A, Core_0B, Core_1A, Core_1B, Core_2A, Core_2B, Core_3A, Core_3B) along with other core arrays of bitcells (Core_4A, Core_4B, Core_5A, Core_5B, Core_6A, Core_6B, Core_7A, Core_7B). Also, the BML architecture 504B has local control circuitry (Ctrl0, Ctrl1, Ctrl2, Ctrl3) that receive clock signal (Clk) and address signal (A< >) for accessing data stored in the bitcells of the multiple core arrays. Also, the BML architecture 504B has global control circuitry (GCtrl) that provides the clock signal (Clk) and address signal (A< >) to the local control circuitry (Ctrl0, Ctrl1, Ctrl2, Ctrl3) by way of buried metal lines (BML1) formed within a substrate. The buried metal lines (BML1) may be used to couple the global control circuitry (GCtrl) to the local control circuitry (Ctrl0, Ctrl1, Ctrl2, Ctrl3).

In various implementations, the BML architecture 504B has local input-output circuitry (IO_0A, IO_08, IO_1A, IO_1B, IO_2A, IO_2B, IO_3A, IO_3B) that receives the accessed data from the bitcells of the multiple core arrays based on operations of the local control circuitry (Ctrl0, Ctrl1, Ctrl2, Ctrl3) using the clock signal (Clk) and the address signal (A< >). Further, the BML architecture 504B includes the global input-output circuitry (GIO_A, GIO_B) that receives the accessed data from local input-output circuitry (IO_0A, IO_0B, IO_1A, IO_1B, IO_2A, IO_2B, IO_3A, IO_3B) by way of the buried metal lines (BML2) formed within the substrate, and the buried metal lines (BML2) may be utilized to couple local input-output circuitry (IO_0A, IO_0B, IO_1A, IO_1B, IO_2A, IO_2B, IO_3A, IO_3B) to the global input-output circuitry (GIO_A, GIO_B).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having multi-page memory with a first core array and bitcells accessible via first wordlines and a second core array with bitcells accessible via second wordlines. The device may have wordline drivers coupled to the bitcells in the first core array via the first wordlines and to the bitcells in the second core array via the second wordlines. The device may have buried metal lines formed within a substrate, and also, the buried metal lines may be used to couple the wordline drivers to the first wordlines.

Described herein are various implementations of a device having multi-bank memory with a first core array and bitcells accessible via first wordlines and a second core array with bitcells accessible via second wordlines. The device may have first wordline drivers coupled to the bitcells in the first core array via the first wordlines. The device may have second wordline drivers coupled in series with the first wordline drivers, and the second wordline drivers are coupled to the bitcells in the second core array via the second wordlines. The device may have buried metal lines formed within a substrate, and the buried metal lines may be used to couple third wordlines in parallel to the first wordlines, and also, the buried metal lines may be used to couple fourth wordlines in parallel to the second wordlines.

Described herein are various implementations of a device having multi-bank memory with multiple core arrays of bitcells. The device may have local control circuitry that receives a clock signal and an address signal for accessing data stored in the bitcells of the multiple core arrays. The device may have global control circuitry that provides the clock signal and the address signal to the local control circuitry by way of buried metal lines formed within a substrate, and the buried metal lines may be utilized to couple the global control circuitry to the local control circuitry.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing refers to implementations of various techniques described herein, various other and further implementations may be devised in accordance with the disclosure herein, which may be determined by the claims that follow.

Although the subject matter has been described in language that is specific to various structural features and/or methodological acts, it is to be understood that subject matter defined in the appended claims is not necessarily limited to the specific features or acts described above. Rather, specific features and acts described above are disclosed as example forms of implementing the claims.

What is claimed is:

1. A device comprising:

multi-page memory having a first core array with bitcells accessible via first wordlines;

wordline drivers coupled to the bitcells in the first core array via the first wordlines; and buried metal lines formed within a substrate, wherein:

the buried metal lines are used to couple the wordline drivers to the first wordlines, the first wordlines are formed in frontside metal layers above the substrate, the buried metal lines are formed within the substrate and extend laterally, parallel to the frontside metal layers, underneath the first wordlines, and the buried metal lines are used to route first wordline signals from the wordline drivers to the bitcells in the first core array via the first wordlines.

2. The device of claim 1, wherein:
the bitcells and the wordline drivers are formed and disposed on the substrate above the buried metal lines formed within the substrate, and
the buried metal lines are formed within the substrate underneath the bitcells, the first wordlines, and the wordline drivers.

3. The device of claim 1, wherein:
the multi-page memory has a second core array with bitcells accessible via second wordlines, wherein the second wordlines are formed in frontside metal layers above the substrate,
the wordline drivers are coupled to the bitcells in the second core array via the second wordlines, and
the second wordlines are used to route second wordline signals from the wordline drivers to the bitcells in the second core array.

4. The device of claim 3, further comprising:
control circuitry that provides sense-amp enable signals to first input-output circuitry for the first core array and to second input-output circuitry for the second core array,
wherein the buried metal lines are used to couple the control circuitry to the first input-output circuitry, and frontside metal lines are used to couple the control circuitry to the second input-output circuitry, and
wherein the buried metal lines are used to route first sense-amp signals from the control circuitry to the first input-output circuitry, and the frontside metal lines are used to route second sense-amp signals from the control circuitry to the second input-output circuitry.

5. The device of claim 3, further comprising:
control circuitry that provides bitline precharge signals to first input-output circuitry for the first core array and to second input-output circuitry for the second core array,
wherein the buried metal lines are used to couple the control circuitry to the first input-output circuitry, and frontside metal lines are used to couple the control circuitry to the second input-output circuitry, and
wherein the buried metal lines are used to route first bitline precharge signals from the control circuitry to the first input-output circuitry, and the frontside metal lines are used to route second bitline precharge signals from the control circuitry to the second input-output circuitry.

6. A device, comprising:
multi-page memory having a first core array with bitcells accessible via first wordlines and a second core array with bitcells accessible via second wordlines;
wordline drivers coupled to the bitcells in the first core array via the first wordlines and to the bitcells in the second core array via the second wordlines;
buried metal lines formed within a substrate, wherein the buried metal lines are used to couple the wordline drivers to the first wordlines; and
break-cell circuitry disposed between the first core array and the second core array,
wherein the break-cell circuitry receives a clock signal and an enable signal and then provides a wordline enable signal to the first core array or the second core array, and
wherein the buried metal lines are used to couple control circuitry to the break-cell circuitry, and the buried metal lines are used to route the wordline enable signal from the control circuitry to the break-cell circuitry.

7. The device of claim 1, wherein:
the multi-page memory has a third core array with bitcells that are accessible via third wordlines and a fourth core array with bitcells that are accessible via fourth wordlines, and
the buried metal lines are used to couple the wordline drivers to the fourth wordlines.

8. The device of claim 7, wherein:
the third wordlines are used to route third wordline signals from the wordline drivers to the bitcells in the third core array, and
the buried metal lines are used to route fourth wordline signals from the wordline drivers to the bitcells in the fourth core array via the fourth wordlines.

9. The device of claim 7, further comprising:
control circuitry that provides sense-amp enable signals to third input-output circuitry for the third core array and to fourth input-output circuitry for the fourth core array,
wherein frontside metal lines are used to couple the control circuitry to the third input-output circuitry, and the buried metal lines are used to couple the control circuitry to the fourth input-output circuitry, and
wherein the frontside metal lines are used to route third sense-amp signals from the control circuitry to the third input-output circuitry, and the buried metal lines are used to route fourth sense-amp signals from the control circuitry to the fourth input-output circuitry.

10. The device of claim 7, further comprising:
control circuitry that provides bitline precharge signals to third input-output circuitry for the third core array and to fourth input-output circuitry for the fourth core array,
wherein frontside metal lines are used to couple the control circuitry to the third input-output circuitry, and the buried metal lines are used to couple the control circuitry to the fourth input-output circuitry, and
wherein the frontside metal lines are used to route third bitline precharge signals from the control circuitry to the third input-output circuitry, and the buried metal lines are used to route fourth bitline precharge signals from the control circuitry to the fourth input-output circuitry.

11. The device of claim 10, further comprising:
break-cell circuitry disposed between the third core array and the fourth core array,
wherein the break-cell circuitry receives a clock signal and an enable signal and then provides a wordline enable signal to the third core array or the fourth core array, and
wherein the buried metal lines are used to couple the control circuitry to the break-cell circuitry, and the buried metal lines are used to route the wordline enable signal from the control circuitry to the break-cell circuitry.

12. A device comprising:
multi-bank memory having a first core array with bitcells accessible via first wordlines and a second core array with bitcells accessible via second wordlines;
first wordline drivers coupled to the bitcells in the first core array via the first wordlines;
second wordline drivers coupled in series with the first wordline drivers, wherein the second wordline drivers are coupled to the bitcells in the second core array via the second wordlines; and
buried metal lines formed within a substrate, wherein the buried metal lines are used to couple third wordlines in parallel to the first wordlines, and wherein the buried metal lines are used to couple fourth wordlines in parallel to the second wordlines.

13. The device of claim 12, wherein:

the bitcells, the first wordline drivers and the second wordline drivers are formed and disposed on the substrate above the buried metal lines formed within the substrate, the first wordlines and the second wordlines are formed in frontside metal layers above the substrate, and the buried metal lines are formed within the substrate underneath the bitcells, the first wordlines, the second wordlines, the first wordline drivers and the second wordline drivers.

14. The device of claim 12, wherein:

the first wordlines are used to route first wordline signals from the first wordline drivers to the bitcells in the first core array and to the second wordline drivers, the buried metal lines are used to route the first wordline signals from the first wordline drivers to the second wordlines drivers, the second wordlines are used to route second wordline signals from the second wordline drivers to the bitcells in the second core array, and the buried metal lines are used to route the second wordline signals from the second wordline drivers to the bitcells in the second core array.

15. The device of claim 12, further comprising:

third wordline drivers coupled in parallel with the first wordline drivers; and open-breaks formed in the first wordlines that decouple the first wordline drivers from the second wordline drivers.

16. The device of claim 15, wherein:

the first wordlines are used to route first wordline signals from the first wordline drivers to the bitcells in the first core array, the buried metal lines are used to route the first wordline signals from the first wordline drivers to the second wordlines drivers, the second wordlines are used to route second wordline signals from the second wordline drivers to the bitcells in the second core array, and the buried metal lines are used to route the second wordline signals from the second wordline drivers to the bitcells in the second core array.

17. The device of claim 1, wherein the buried metal lines are coupled to the first wordlines by way of through-silicon vias.

18. The device of claim 1, wherein the buried metal lines are coupled to the wordline drivers by way of through-silicon vias.

* * * * *